US012568678B2

(12) United States Patent
Wu et al.

(10) Patent No.: US 12,568,678 B2
(45) Date of Patent: Mar. 3, 2026

(54) METHODS OF FORMING SEMICONDUCTOR DEVICE AND DIELECTRIC FIN

(71) Applicant: Taiwan Semiconductor Manufacturing Co., Ltd., Hsinchu (TW)

(72) Inventors: Wei-Hao Wu, Hsinchu (TW); Ying Tsung Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 361 days.

(21) Appl. No.: 18/333,923

(22) Filed: Jun. 13, 2023

(65) Prior Publication Data
US 2024/0421004 A1 Dec. 19, 2024

(51) Int. Cl.
*H10D 84/03* (2025.01)
*H10D 84/01* (2025.01)
*H10D 84/85* (2025.01)

(52) U.S. Cl.
CPC ....... *H10D 84/038* (2025.01); *H10D 84/0188* (2025.01); *H10D 84/0193* (2025.01); *H10D 84/853* (2025.01)

(58) Field of Classification Search
None
See application file for complete search history.

(56) References Cited

U.S. PATENT DOCUMENTS

| 2019/0067417 A1* | 2/2019 | Ching ................. H10D 84/834 |
| 2020/0091311 A1* | 3/2020 | Hsu ..................... H01L 21/0228 |
| 2023/0116949 A1 | 4/2023 | Lin et al. |
| 2023/0155006 A1 | 5/2023 | Kao et al. |
| 2023/0163075 A1 | 5/2023 | Lin et al. |
| 2023/0163191 A1 | 5/2023 | Lee et al. |

FOREIGN PATENT DOCUMENTS

| TW | 202322397 A | 6/2023 |
| TW | 202322399 A | 6/2023 |

* cited by examiner

*Primary Examiner* — Steven B Gauthier
*Assistant Examiner* — Lamont B Koo
(74) *Attorney, Agent, or Firm* — Slater Matsil, LLP

(57) ABSTRACT

In an embodiment, a method includes: forming a plurality of fins over a substrate, the plurality of fins comprising: a first semiconductor fin adjacent to an isolation region; and a dielectric fin embedded in the isolation region; depositing a silicon layer over a first surface of the first semiconductor fin, a second surface of the dielectric fin, and a third surface of the isolation region; forming an oxide layer over the silicon layer; removing a portion of the oxide layer and the silicon layer to expose the second surface of the dielectric fin; forming a dummy gate over a remaining portion of the oxide layer and between the plurality of fins; forming a first epitaxial region in the first semiconductor fin; and replacing the dummy gate with a gate structure.

20 Claims, 27 Drawing Sheets

METHODS OF FORMING SEMICONDUCTOR DEVICE AND DIELECTRIC FIN

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
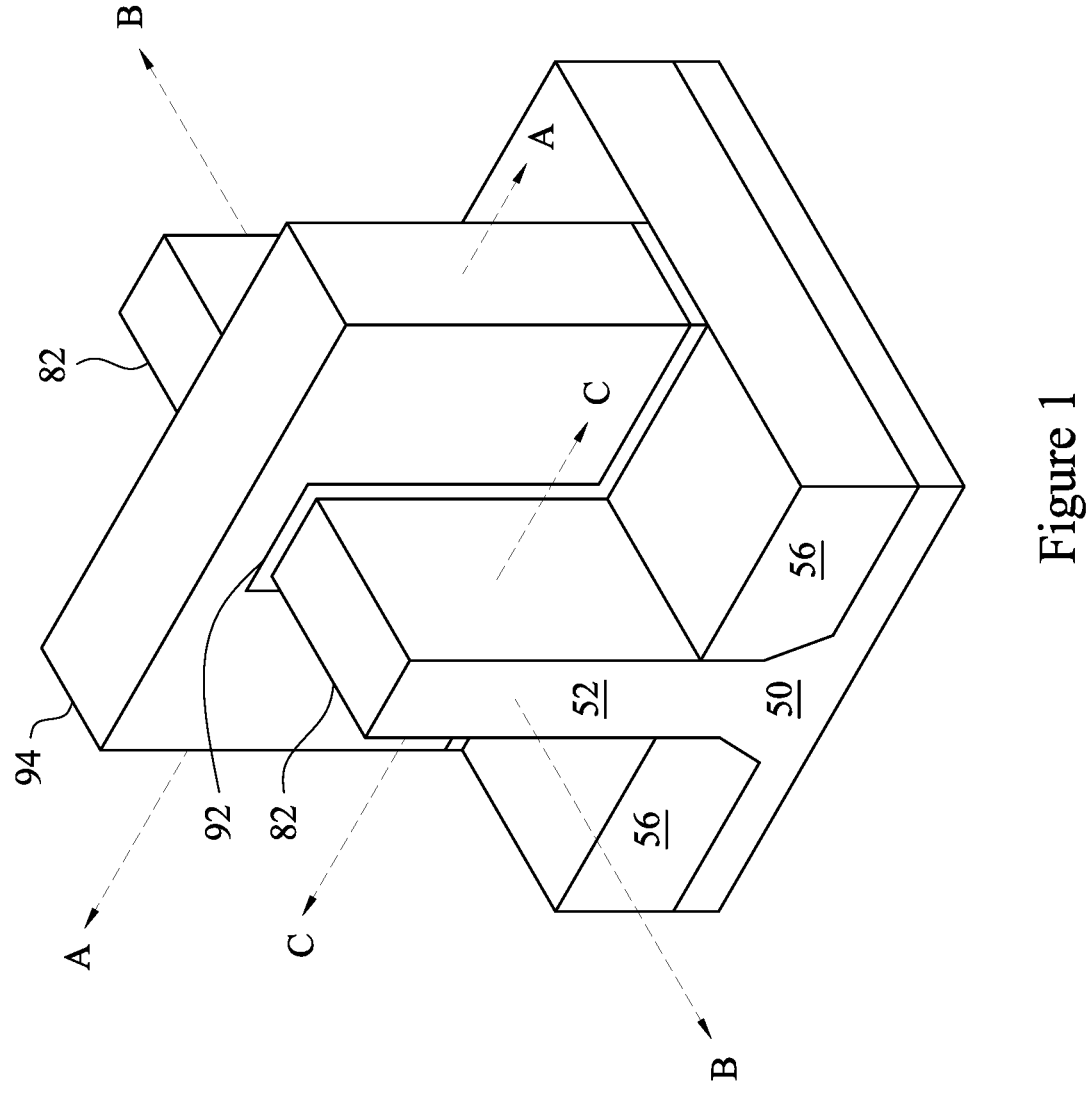
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described in a particular context, an integrated circuit die including fin field-effect transistors (finFETs). Various embodiments may be applied, however, to dies including other types of transistors (e.g., nano-FETs, such as nanowire FETs, nanosheet FETs, or the like, planar transistors, or the like) in lieu of or in combination with the finFETs.

In various embodiments, finFETs are formed to include a plurality of semiconductor fins, wherein some adjacent semiconductor fins are separated from one another by an isolation region and a dielectric fin. For example, a semiconductor fin may be separated from a dielectric fin by a gap region that is directly above an isolation region. The process of forming a dummy gate structure (e.g., a dummy dielectric layer and a dummy gate) over the semiconductor fin and the dielectric fin may be performed to provide sufficient space in the gap region to benefit deposition of the dummy gate as well as subsequent removal of the dummy gate during a gate replacement process. In particular, a silicon layer is formed to cover both the semiconductor fin and the dielectric fin, and the dummy dielectric layer is formed over the silicon layer. The dummy dielectric layer and the silicon layer are then removed from the dielectric fin, wherein the silicon layer serves as a protective layer (e.g., an etch stop layer) for the dielectric fin and the isolation region during the removal process. As a result, the gap region between the semiconductor fin and the dielectric fin is widened to benefit deposition and subsequent removal of the dummy gate. In addition, as discussed in greater detail below, the disclosed embodiments allow for adjustments to dimensions of various features and to process parameters in order to achieve additional benefits. The resulting integrated circuit that includes these semiconductor devices (e.g., finFETs) may be fabricated with greater efficiency and improved yield while also providing better performance and reliability.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. Source/drain region(s) 82 may refer to a source or a drain, individually or collectively dependent upon the context. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 23B are cross-sectional views of intermediate stages in the manufacturing of FinFETs, in accordance with some embodiments. FIGS. 2 through 13 illustrate reference cross-section A-A illustrated in FIG. 1, except for multiple fins/FinFETs. FIGS. 14A, 15A, 16A, 17A, 18A, 19A, 20A, 21A, 22A, and 23A are illustrated along reference cross-section A-A illustrated in FIG. 1, and FIGS. 14B, 15B, 16B, 17B, 18B, 19B, 20B, 20C, 21B, 22B, and 23B are illustrated along a similar cross-section B-B illustrated in FIG. 1, except for multiple fins/FinFETs. FIGS. 16C, 16D, 17C, 17D, 21C, and 21D are illustrated along reference cross-section C-C illustrated in FIG. 1, except for multiple fins/FinFETs.

Figure 2:
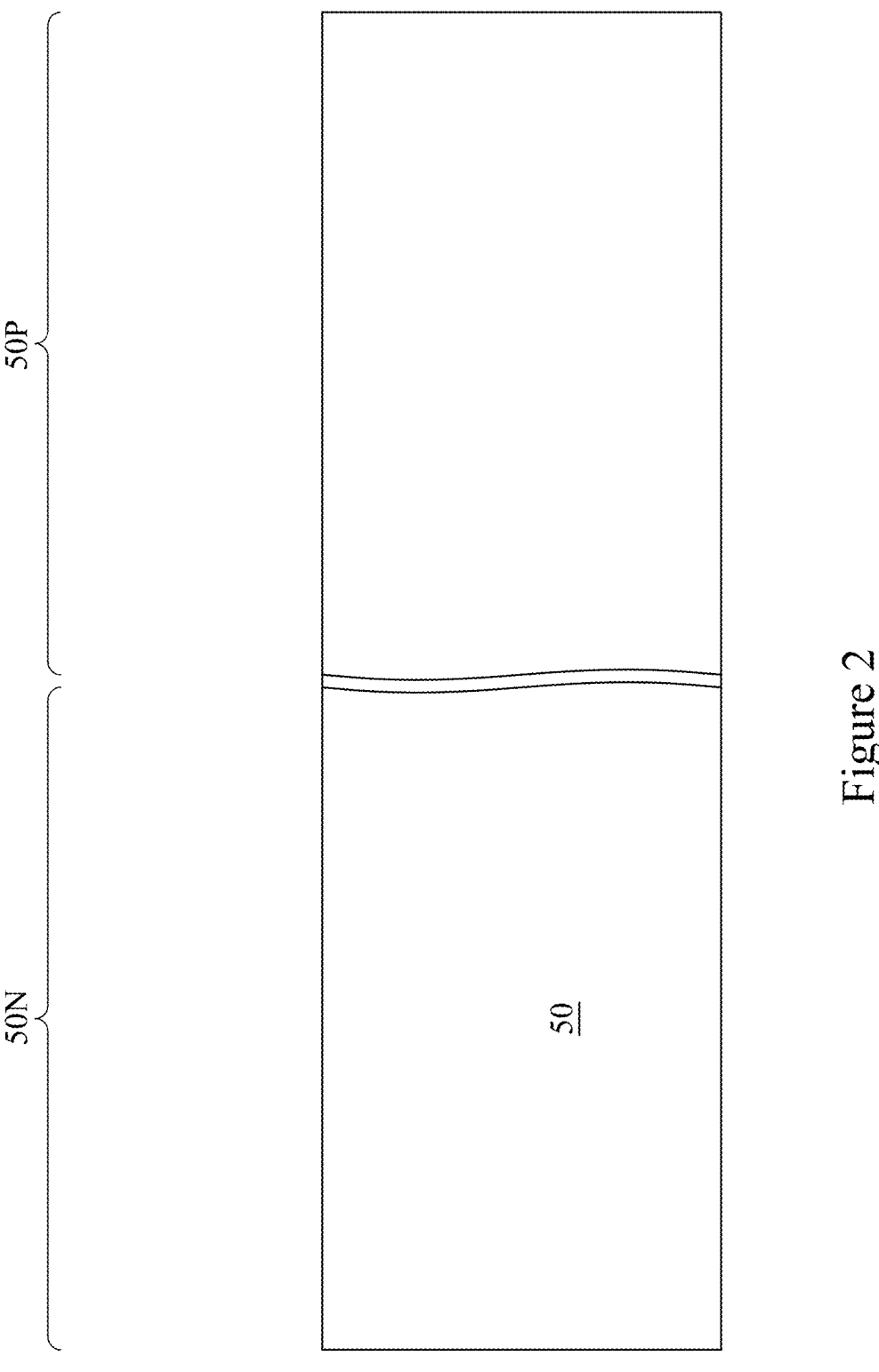
FIGS. 2, 3, 4, 5, 6, 7, 8, 9, 10, 11, 12, 13, 14A, 14B, 15A, 15B, 16A, 16B, 16C, 16D, 17A, 17B, 17C, 17D, 18A, 18B, 19A, 19B, 20A, 20B, 20C, 21A, 21B, 21C, 21D, 22A, 22B, 23A, and 23B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a device region along the substrate 50 which includes one or more n-type regions 50N and one or more p-type regions 50P. The n-type regions 50N can be for forming n-type devices, such as NMOS transistors, e.g., n-type FinFETs. The p-type regions 50P can be for forming p-type devices, such as PMOS transistors, e.g., p-type Fin-FETs. Some of the n-type regions 50N may be physically separated from the p-type regions 50P (and vice versa), and any number of device features (e.g., other active devices, doped regions, isolation structures, etc.) may be disposed between the n-type regions 50N and p-type regions 50P. In addition, some of the n-type regions 50N may be adjacent to some of the p-type regions 50P. The illustrations are intended to represent any such arrangements of the n-type regions 50N and the p-type regions 50P, as applicable.

Figure 3:
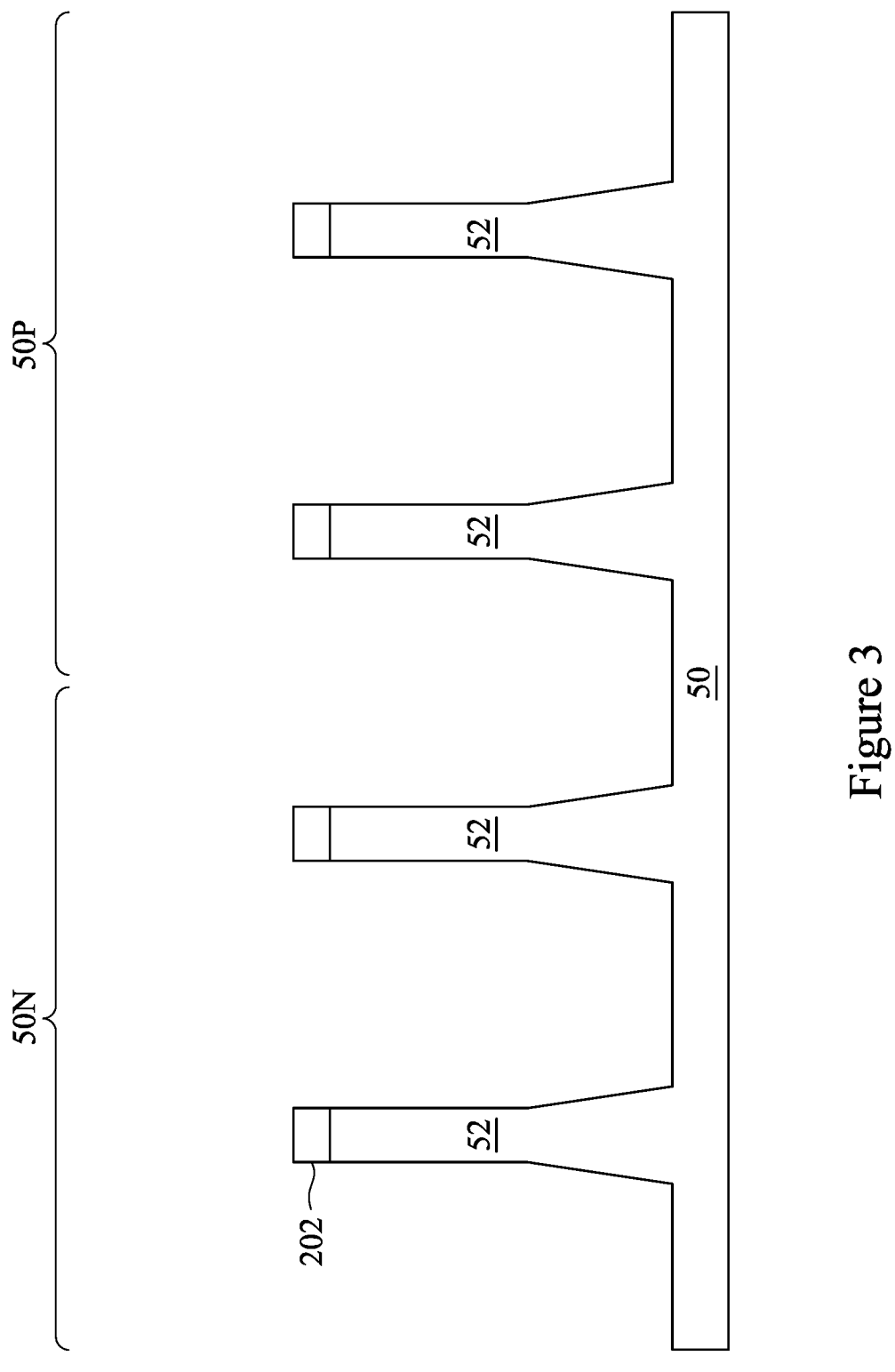

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. As a result, the fins 52 are composed of the same semiconductor material as the substrate 50. As discussed in greater detail below, some of the fins 52 are replaced with a different semiconductor material, such that fins 52A remain in the n-type region 50N and fins 52B are formed in the p-type region 50P (see FIG. 6). In some embodiments, the fins 52A and the substrate 50 may comprise silicon, and the fins 52B will comprise silicon germanium.

The fins may be patterned by any suitable method. For example, the fins 52 may be patterned by forming a mask 202 over the substrate 50 and using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Although not specifically illustrated, in some embodiments, the mask 202 comprises a plurality of layers, such as an oxide (e.g., silicon oxide), a nitride (e.g., silicon nitride), and a hardmask at the top. In some embodiments, the mask 202 (or other layer) may remain on the fins 52.

Figure 4:
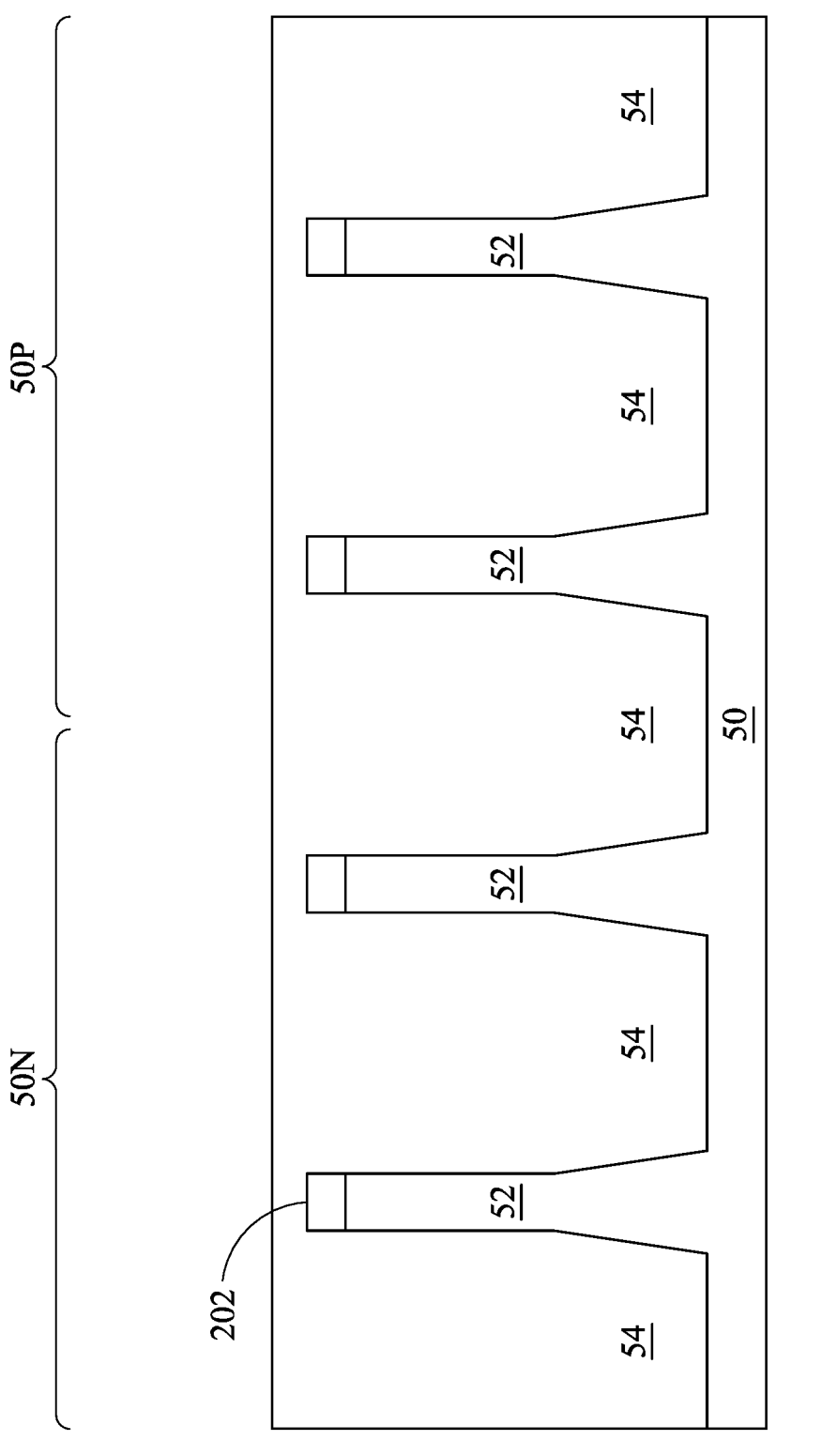

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
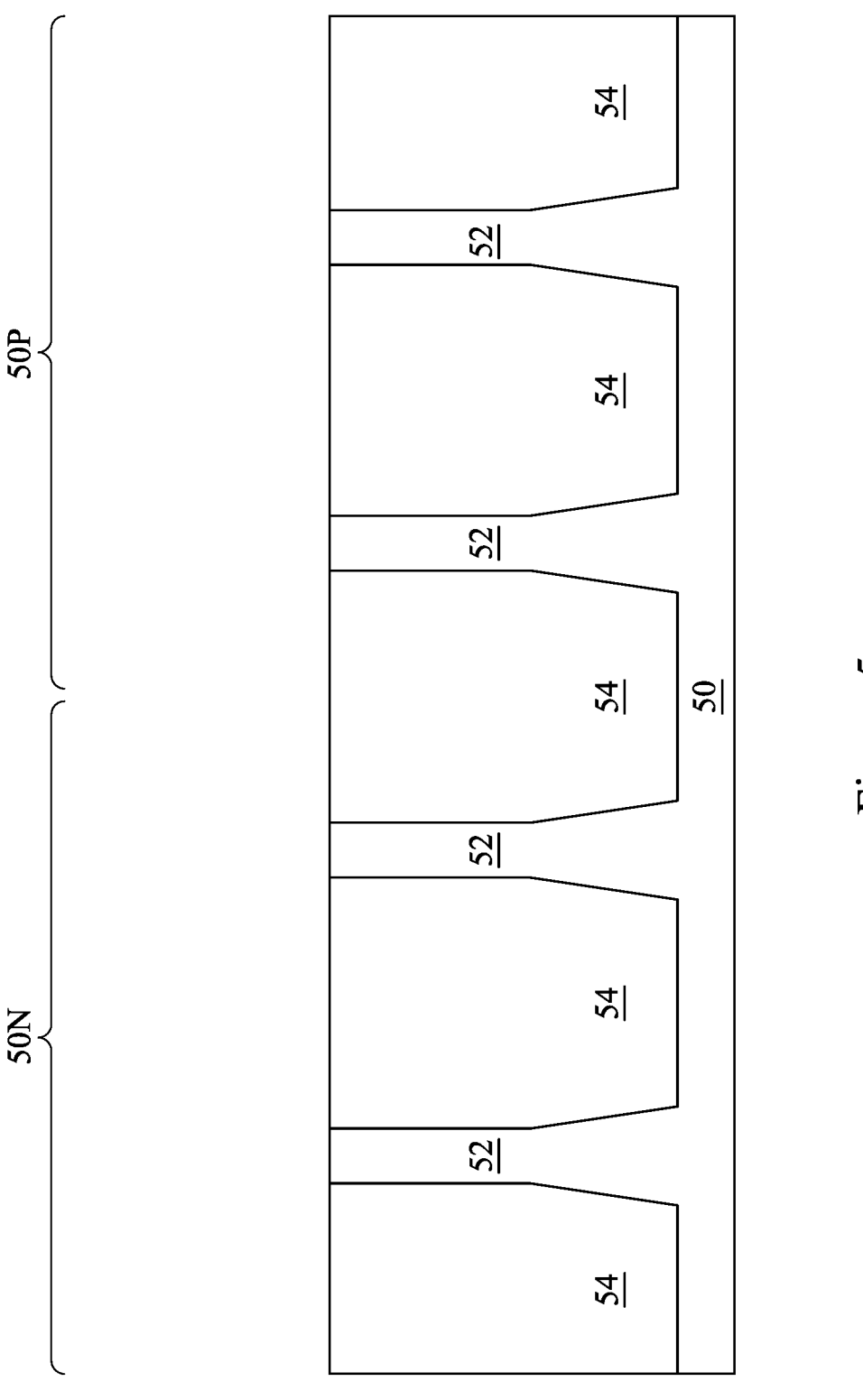

In FIG. 5, a removal process is applied to the insulation material 54 to remove excess insulation material 54 over the fins 52 and the mask 202 (if present). In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which the mask 202 remains on the fins 52, the planarization process may expose the mask 202 or remove the mask 202 such that top surfaces of the mask 202 or the fins 52, respectively, and the insulation material 54 are level after the planarization process is complete.

Figure 6:
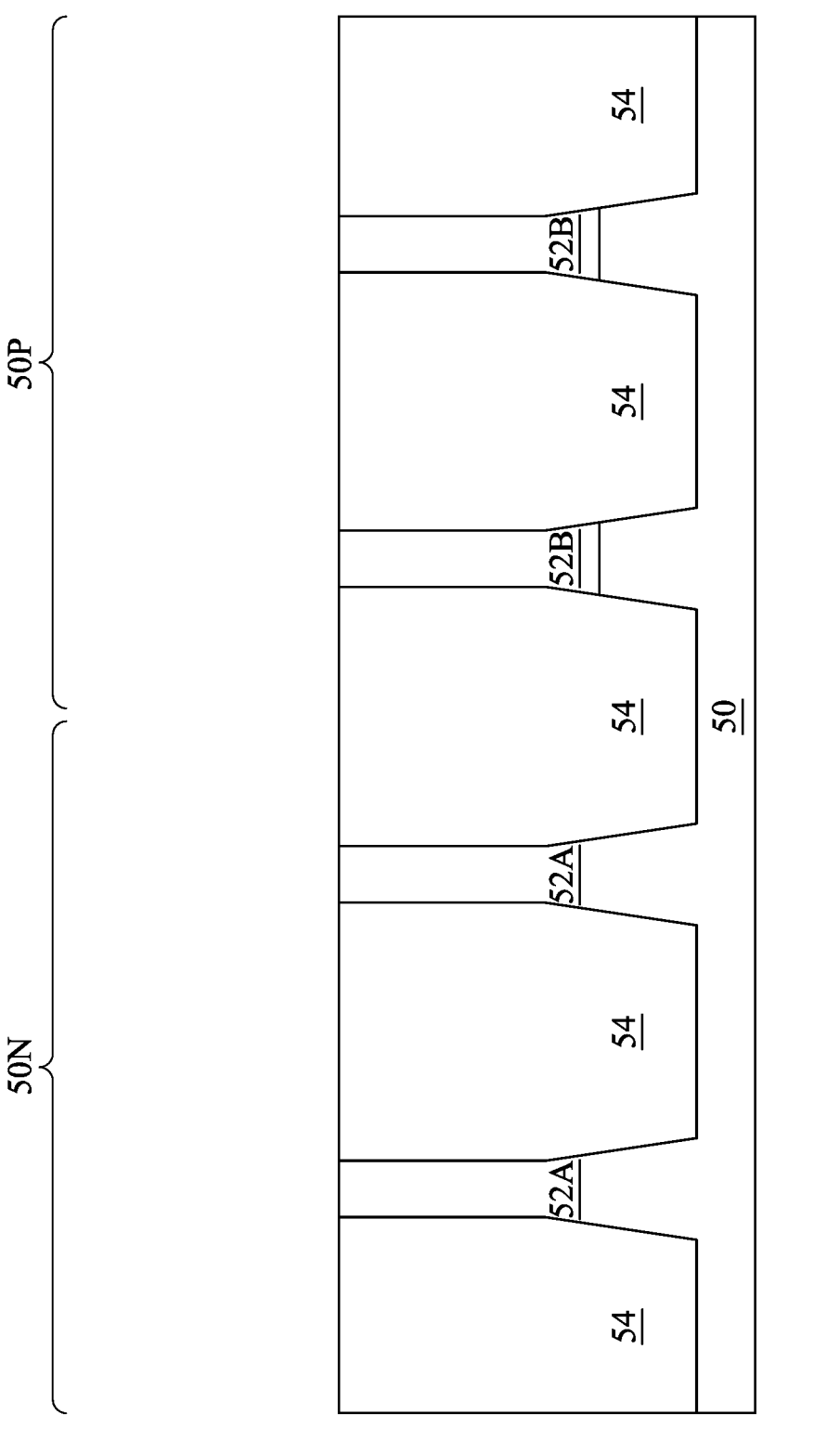

In FIG. 6, in accordance with some embodiments, some of the fins 52 are converted into fins 52B and the remaining fins 52 may be referred to as fins 52A. For example, the fins 52 include the fins 52A, e.g., already formed in the n-type region 50N and the fins 52B, e.g., being formed in the p-type region 50P. As illustrated, the fins 52B are formed in the insulation material 54 by replacing some of the fins 52 in the p-type region 50P. In some embodiments, the fins 52B may comprise a different semiconductor material from the fins 52A and the substrate 50.

In some embodiments, a removal process is performed to remove upper portions, majorities, or entireties of some of the fins 52 (e.g., in the p-type region 50P). In accordance with some embodiments, the trenches may be formed using one or more suitable photolithographic masking (not specifically illustrated) and etching processes. The fins 52B are then formed by forming a semiconductor material in the trenches. In some embodiments, the semiconductor material may be formed by epitaxially (e.g., heteroepitaxially) growing the semiconductor material in the trenches over the partially removed fins 52. Following growth of the fins 52B, a planarization process (e.g., CMP) may be performed to level the fins 52B with the insulation material 54 and the fins 52A, while also removing any semiconductor material that may have formed over or above the insulation material 54. In some embodiments, the fins 52B are formed from a material different than the fins 52A (e.g., silicon), such as silicon germanium (Si$_x$Ge$_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Figure 7:
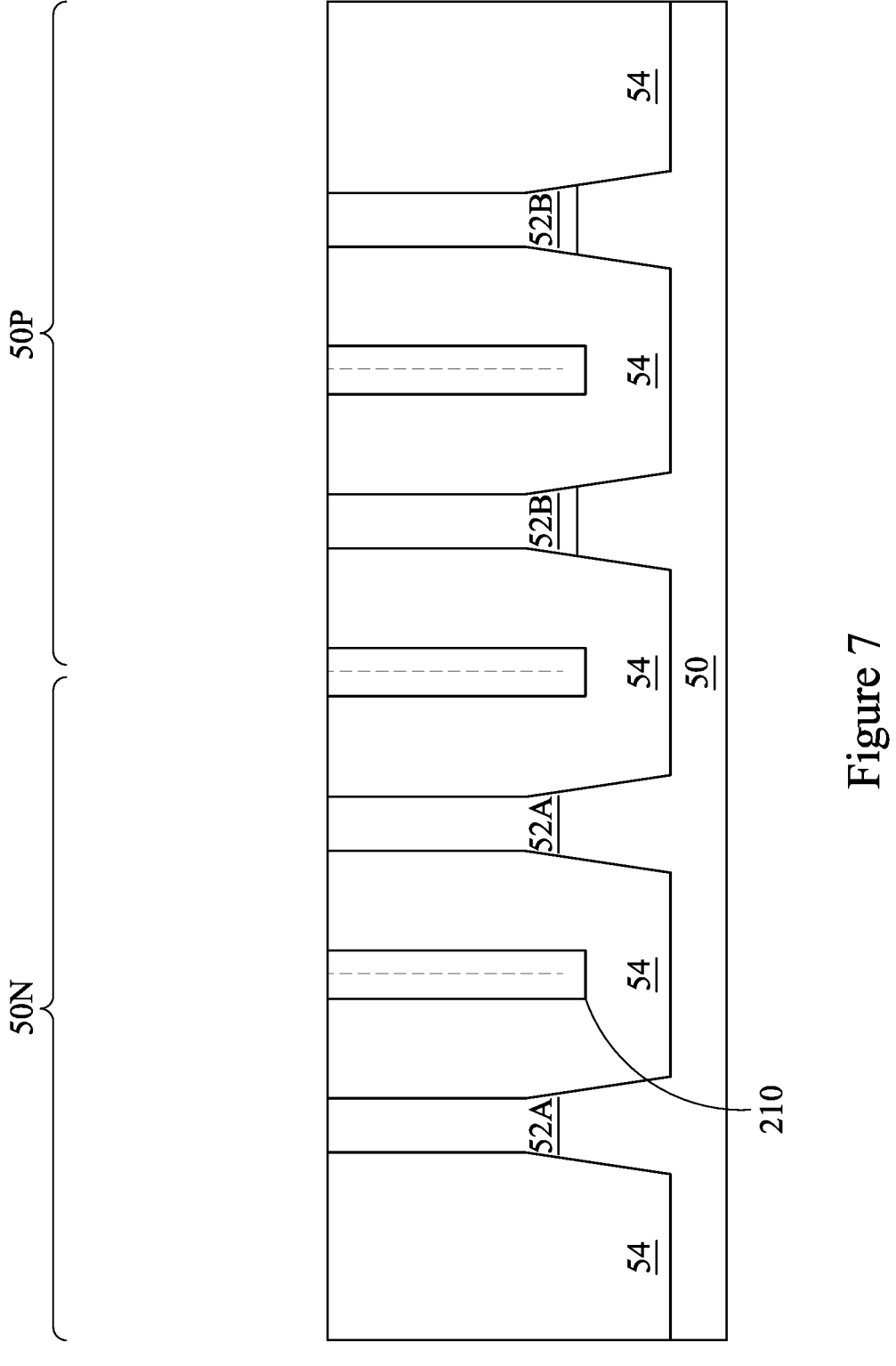

In FIG. 7, dielectric fins 210 are formed in the insulation material 54 between some of the fins 52. The dielectric fins 210 may also be referred to as dummy fins, dummy dielectric fins, or the like. The dielectric fins 210 may provide electrical isolation between certain components (e.g., active devices) of the integrated circuit on opposing sides of the dielectric fins 210. The dielectric fins 210 may be formed using any suitable method. In some embodiments, the dielectric fins 210 may comprise dielectric materials that provide insulation between subsequently formed source/drain regions 82 (see FIGS. 16A-16D). The dielectric fins 210 may be formed by forming trenches in the insulation material 54, for example, using one or more photolithographic masking and etching processes. One or more materials, such as silicon nitride, silicon oxide, silicon carbonitride, silicon oxycarbonitride, combinations of these, or the like, may then be formed in the trenches by CVD, ALD, the like, or a combination thereof. The structure may then be planarized (e.g., CMP) to level the dielectric fins 210 with the insulation material 54 and the fins 52.

Figure 8:
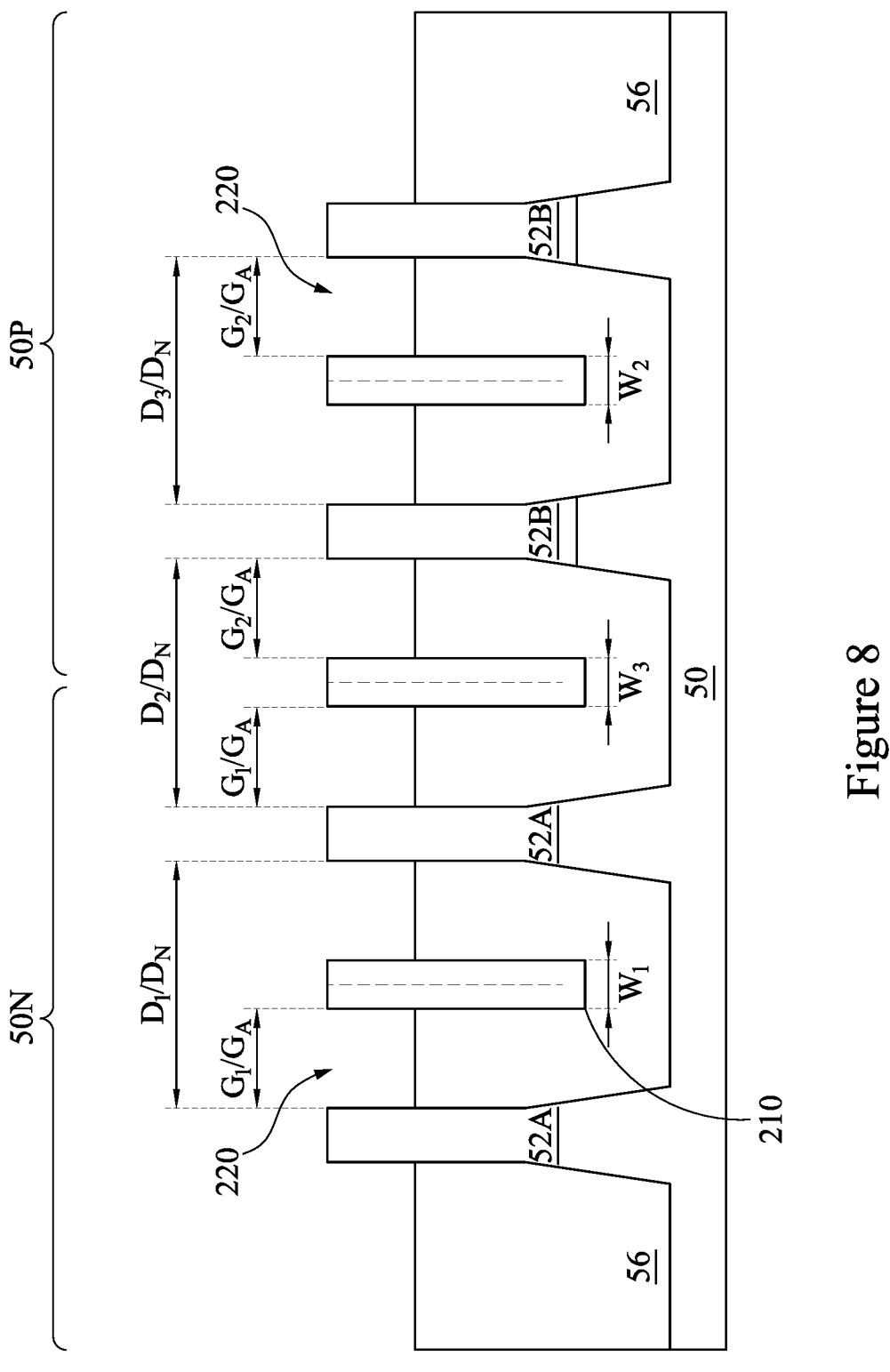

In FIG. 8, the insulation material 54 is recessed to form Shallow Trench Isolation (STI) regions 56. The insulation material 54 is recessed such that upper portions of fins 52 and the dielectric fins 210 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52 and the dielectric fins 210). For example, an oxide removal using, for example, dilute hydrofluoric (dHF) acid may be used.

The process described with respect to FIGS. 2 through 6 is just one example of how the fins 52 (e.g., the fins 52A, 52B) may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins (e.g., the fins 52A). Additionally, in some embodiments, heteroepitaxial structures can be used for the fins 52 (e.g., the fins 52B). In such embodiments, the fins 52B comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52B. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 (e.g., the fins 52B) may be formed from silicon germanium (Si$_x$Ge$_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

In addition, the dielectric fins 210 may be formed in additional ways not previously described. For example, in some embodiments discussed above (not specifically illustrated), the fins 52 may be formed before depositing the insulation material 54. A conformal sacrificial layer may then be deposited over the fins 52 and along upper surfaces of the substrate 50 such that gaps remain within the sacrificial layer between adjacent fins 52. Dielectric material may be deposited over the sacrificial layer and within the gaps. The structure may be planarized to remove the dielectric material from over the sacrificial layer, thereby forming the dielectric fins 210 from the dielectric material remaining in the gaps within the sacrificial layer. Afterward, an etch process may be performed to remove the sacrificial layer from between the dielectric fins 210 and the fins 52. In some embodiments, some of the sacrificial layer may remain below the dielectric fins 210 and above the substrate 50. The insulation material 54 may then be deposited and recessed to form the STI regions 56, similarly as described above.

In accordance with some embodiments, the fins 52 may have varying pitches and widths resulting in the fins 52A being a first distance D$_1$ from one another, the fins 52B being a second distance $D_2$ from one another, and the fins 52A and the fins 52B being a third distance $D_3$ from one another. Note that the distances $D_1$, $D_2$, $D_3$ (collectively, the distances $D_N$) may be measured laterally at nearest points (e.g., at widest portions) between the respective components above the STI regions 56. Any of the distances $D_N$ may be substantially the same as or different from one another, and each may vary throughout the device region of the integrated circuit. In addition, the dielectric fins 210 may be spaced apart from the fins 52A by a first gap $G_1$, and the dielectric fins 210 may be spaced apart from the fins 52B by a second gap $G_2$. The gaps $G_1$, $G_2$ (collectively, $G_A$) may be substantially the same as or different from one another, and each may vary throughout the device region of the integrated circuit.

Further, the dielectric fins 210 between two fins 52A may be formed with widths $W_1$, dielectric fins 210 between two fins 52B may be formed with widths $W_2$, and dielectric fins 210 between a fin 52A and a fin 52B may be formed with widths $W_3$. Note that the widths $W_1$, $W_2$, $W_3$, (collectively, the widths $W_A$) may be measured laterally at nearest points to the respective fins 52 (e.g., at widest points of the dielectric fins 210). As illustrated, the distance $D_1$ may be a sum of two gaps $G_1$ and the width $W_1$. Similarly, the distance $D_3$ may be a sum of two gaps $G_2$ and the width $W_2$, the distance $D_2$ may be a sum of the gap $G_1$, the gap $G_2$, and the width $W_3$. As discussed in greater detail below, embodiments disclosed herein allow for variations in the distances $D_N$ and the widths $W_N$ to achieve advantages in the fabrication and performance of the devices of the integrated circuit. It should be appreciated that the distances $D_N$ may represent among the shortest of such distances in the integrated circuit, and those distances $D_N$ may range from 50 nm to 60 nm.

As indicated in FIG. 8, the gaps $G_A$ are measured in gap regions 220, which become particularly relevant during various subsequent steps. For example, as discussed in greater detail below, material of a dummy gate layer is deposited over the dummy dielectric layer 60 and within the gap regions 220 (see FIG. 13). In addition, in later steps, the same material is removed from over the dummy dielectric layer 60 and from within the gap regions 220 (see FIGS. 19A-19B). In some exemplary embodiments discussed herein, an exemplary distance $D_N$ may be 50 nm, and an exemplary width $W_A$ may be 10 nm. As such, the corresponding exemplary gaps $G_A$ may be 20 nm each.

Further in FIG. 8, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52A and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52B and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 9:
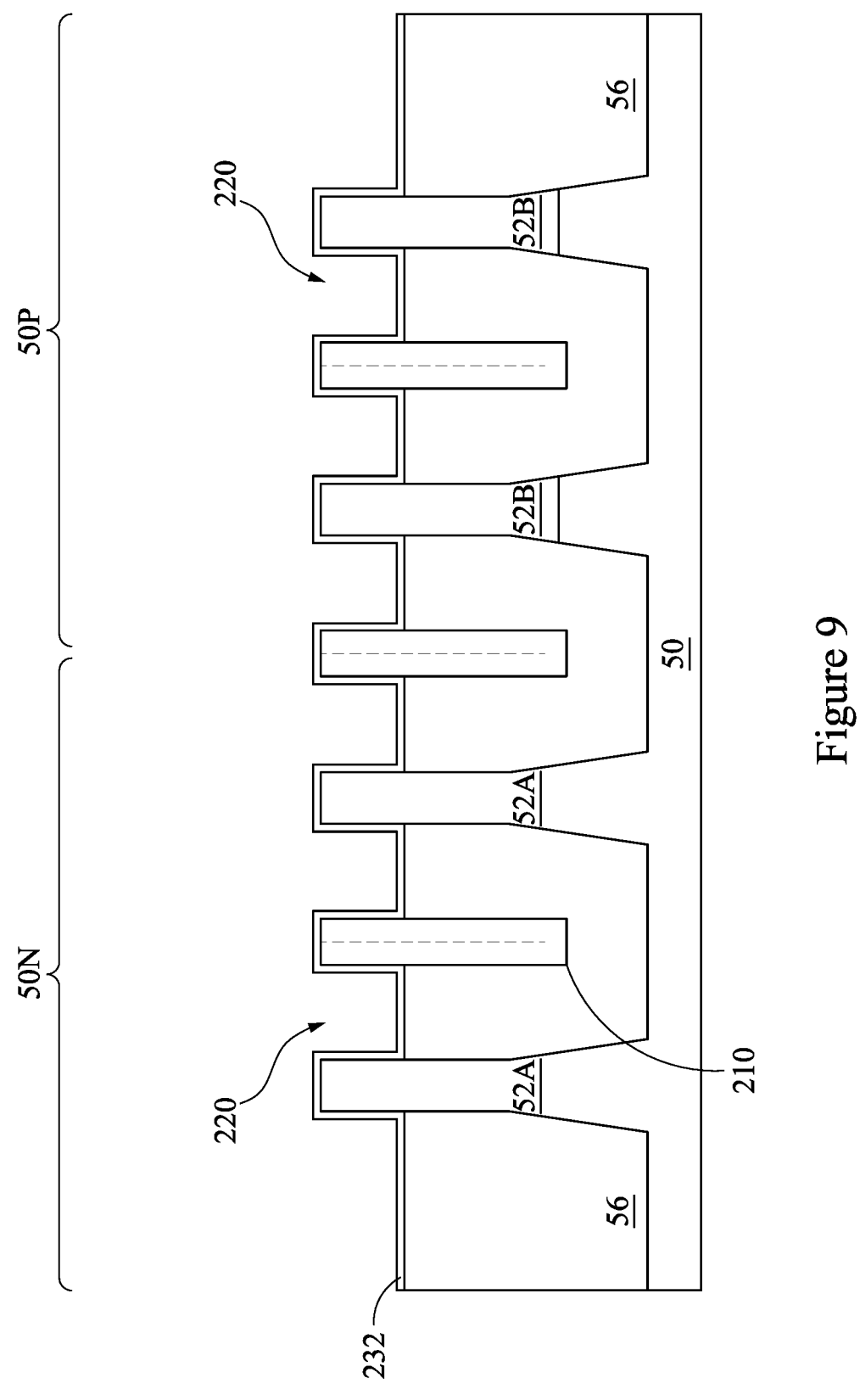

In FIG. 9, a silicon layer 232 (e.g., a silicon cap or a silicon cap layer) is deposited over the fins 52, the dielectric fins 210, and the STI regions 56. As illustrated, the silicon layer is formed over and along exposed surfaces of the dielectric fins 210 and the STI regions 56 in addition to the semiconductor materials of the fins 52. In some embodiments (not specifically illustrated), a segment of the silicon layer 232 along the fins 52 may have a greater crystallinity than a segment of the silicon layer 232 along the dielectric fins 210 and the STI regions 56, although both segments of the silicon layer 232 may be non-crystalline (e.g., polycrystalline or amorphous).

In some embodiments, the silicon layer 232 may be formed as a non-selective deposition and growth. For example, the silicon layer 232 may be deposited at temperatures of about or less than 400° C., at pressures ranging from 1 Torr to 4 Torr, and for a duration ranging from 15 minutes to 30 minutes. The silicon layer 232 may be deposited with a thickness ranging from 0.5 nm to 1.0 nm (e.g., 0.8 nm). As discussed in greater detail below (see FIG. 10), the silicon layer 232 may have a substantially consistent thickness or may vary over the respective features (e.g., the fins 52A, the fins 52B, the dielectric fins 210, and the STI regions 56).

Optionally, in accordance with various embodiments, a nitrogen soak treatment may precede the formation of the silicon layer 232. The nitrogen soak treatment may improve subsequent formation of the silicon layer 232 by nitridizing exposed surfaces of the fins 52, the dielectric fins 210, and the STI regions 56. The precursor materials may include ammonia, nitrogen gas, the like, or a combination thereof, and may be performed using a suitable method, such as a plasma treatment.

Figure 10:
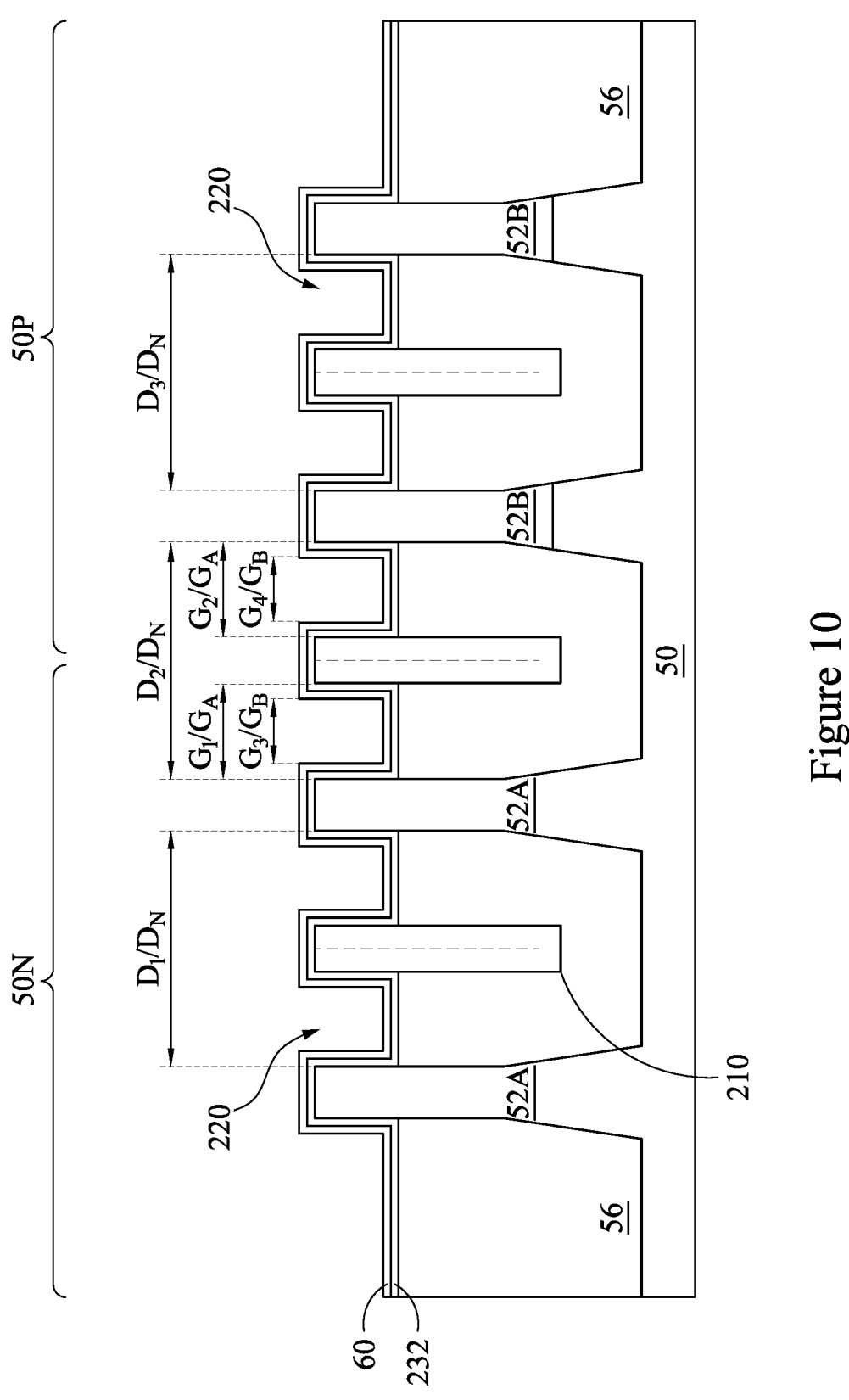

In FIG. 10, a dummy dielectric layer 60 is formed on the silicon layer 232. The dummy dielectric layer 60 may be, for example, silicon oxide, silicon nitride, a combination thereof, or the like, and may be deposited or thermally grown according to acceptable techniques. For example, the dummy dielectric layer 60 may be formed by converting a portion of the silicon layer 232 to an oxide. In some embodiments, the dummy dielectric layer 60 is deposited by CVD, ALD, the like, or a suitable method.

Following formation of the dummy dielectric layer 60, the silicon layer 232 may have a thickness as discussed above, such as about 0.8 nm, and the thickness may be greater over the fins 52 as compared to over the dielectric fins 210 and the STI regions 56. As such, the thickness of the silicon layer 232 over the fins 52 may range from 0.8 nm to 1.0 nm, and in some embodiments being thicker over the fins 52A than over the fins 52B. In addition, the thickness of the silicon layer 232 over the dielectric fins 210 and the STI regions 56 may range from 0.5 nm to 0.8 nm. In some embodiments, the thickness of the silicon layer 232 may be substantially the same (e.g., 0.8 nm) over all of the features. Further, the dummy dielectric layer 60 may have a thickness ranging from 2.5 nm to 3.0 nm (e.g., 2.8 nm), and the dummy dielectric layer 60 may have a substantially consistent thickness over the respective features (e.g., the fins 52A, the fins 52B, the dielectric fins 210, and the STI regions 56).

In addition, with respect to the gap regions 220, portions of the dummy dielectric layer 60 over the dielectric fins 210 may be spaced apart from portions of the dummy dielectric layer 60 over the fins 52A by a third gap $G_3$, and portions of the dummy dielectric layer 60 over the dielectric fins 210 may be spaced apart from portions of the dummy dielectric layer 60 over the fins 52B by a fourth gap $G_4$. The gaps $G_3$, $G_4$ (collectively, $G_B$) may be substantially the same as or different from one another, and each may vary throughout the device region of the integrated circuit. As illustrated, the gaps $G_B$ are less than the gaps $G_4$. In reference to the exemplary embodiments discussed above in connection with FIG. 8 (e.g., exemplary distance $D_N$ being 50 nm, exemplary width $W_A$ being 10 nm), the thickness of the silicon layer 232 may be 0.8 nm and the thickness of the dummy dielectric layer 60 may be 2.7 nm (e.g., a collective thickness of 3.5 nm). As such, the corresponding exemplary gaps $G_B$ may be 13 nm each.

Figure 11:
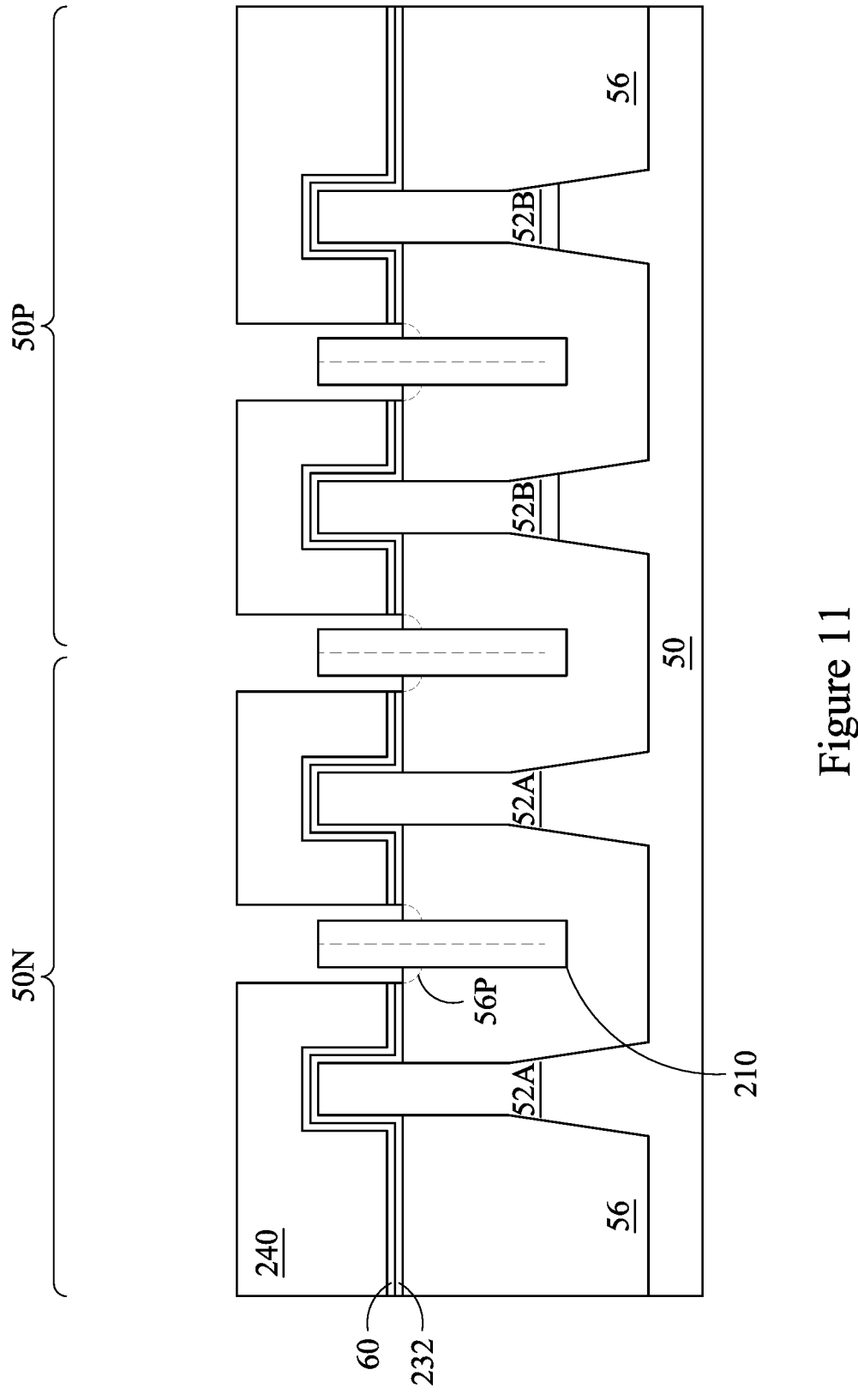

In FIG. 11, a mask layer 240 is formed over the dummy dielectric layer 60 and patterned, and the dummy dielectric layer 60 and the silicon layer 232 are removed from the dielectric fins 210. The mask layer 240 may be a multi-layer mask, including a photoresist and a bottom anti-reflective coating (BARC), and may be formed using any suitable methods. The dummy dielectric layer 60 and the silicon layer 232 may be removed using one or more etch processes. In some embodiments, the silicon layer 232 may serve as an etch stop layer to prevent undesired damage to underlying portions of the STI region 56. As illustrated, portions 56P of the STI regions 56 proximal (e.g., directly adjacent) to the dielectric fins 210 may be exposed following the removal process.

Figure 12:
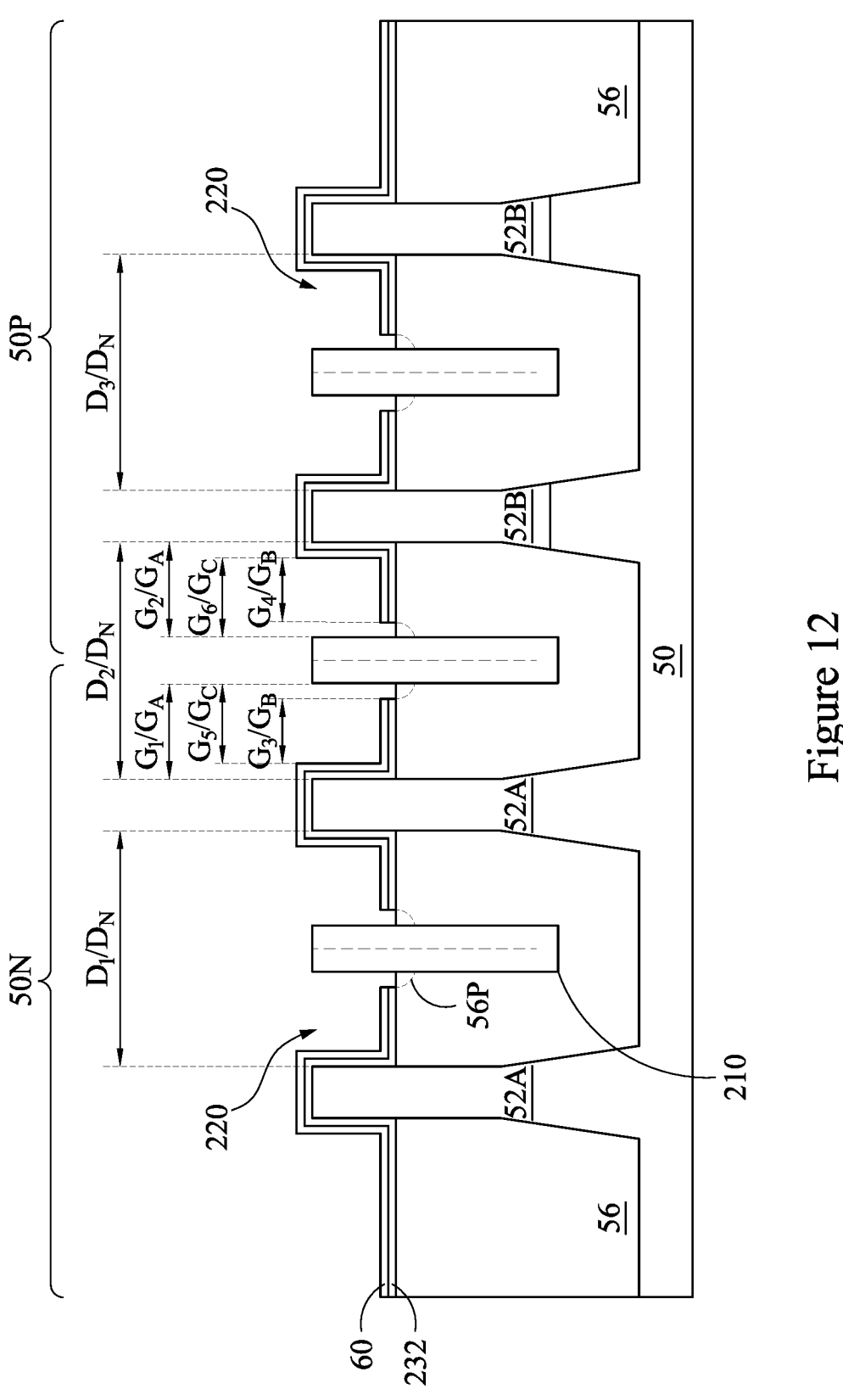

In FIG. 12, the mask layer 240 is removed from the fins 52 and the STI regions 56. For example, in embodiments in which the mask layer 240 includes a photoresist, removal of the mask layer 240 may utilize a process such as ashing, whereby the temperature of the mask layer 240 is raised until the mask layer 240 undergoes a thermal decomposition and may be easily removed. However, any suitable method may be used.

In addition, with respect to the gap regions 220, the dielectric fins 210 may be spaced apart from portions of the dummy dielectric layer 60 over the fins 52A by a fifth gap $G_5$, and the dielectric fins 210 may be spaced apart from portions of the dummy dielectric layer 60 over the fins 52B by a sixth gap $G_6$. The gaps $G_5$, $G_6$ (collectively, $G_C$) may be substantially the same as or different from one another, and each may vary throughout the device region of the integrated circuit. As illustrated, the gaps $G_C$ are less than the gaps $G_4$ while greater than the gaps $G_B$ (e.g., 13 nm each). In reference to the exemplary embodiments discussed above in connection with FIGS. 8-10 (e.g., exemplary distance $D_N$ being 50 nm, exemplary width $W_A$ being 10 nm, and the collective thickness of the silicon layer 232 and the dummy dielectric layer 60 being 3.5 nm), the corresponding exemplary gaps $G_C$ may be 16.5 nm each.

Figure 13:
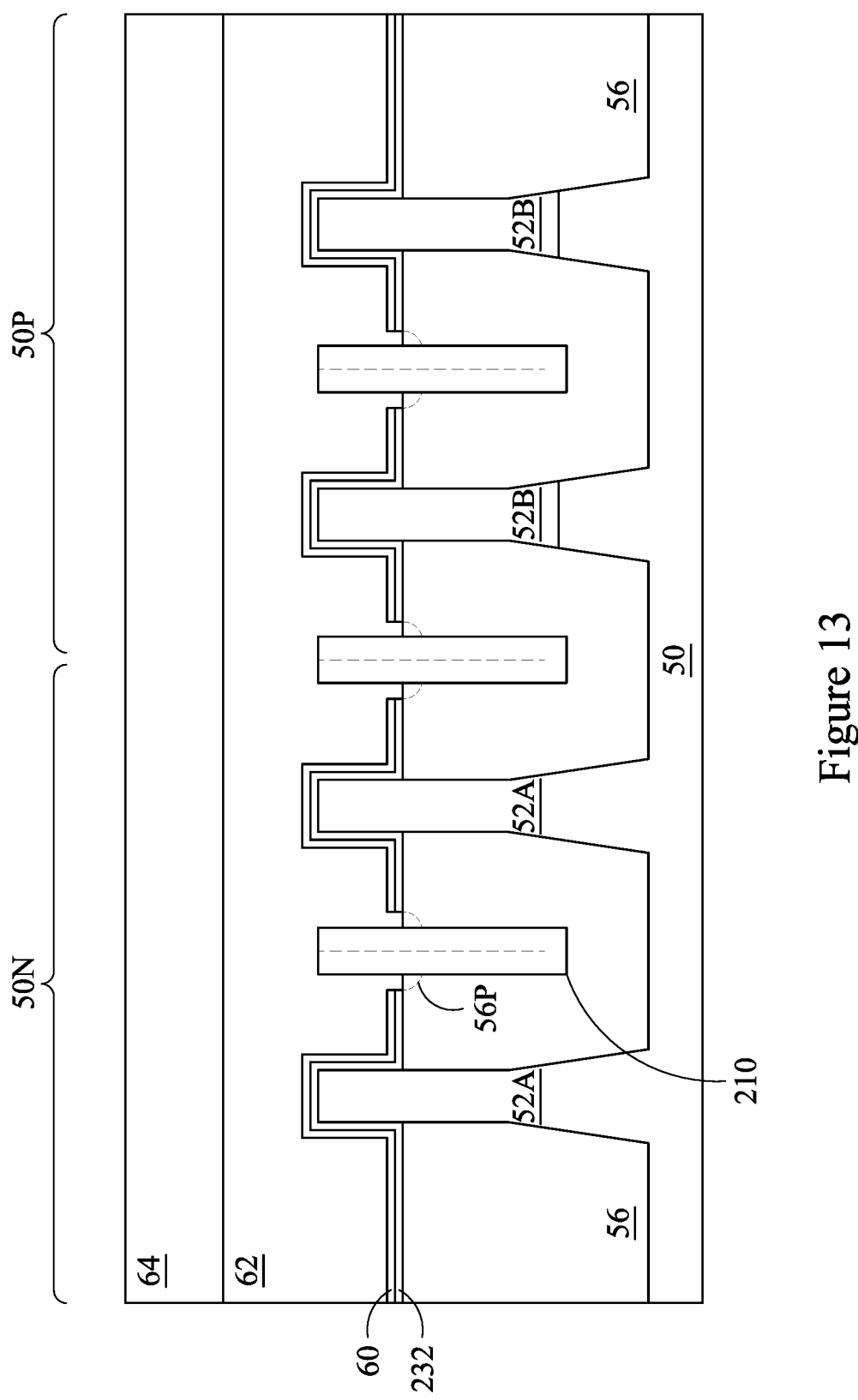

In FIG. 13, a dummy gate layer 62 is formed over the dummy dielectric layer 60 and within the gap regions 220, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (poly-silicon), poly-crystalline silicon germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

Deposition of the dummy gate layer 62 is improved by the previous steps which widened the gap regions 220 from the gaps $G_B$ to the gaps $G_C$. In particular, the wider gap regions 220 allow for the dummy gate layer 62 to be deposited more efficiently, at a higher yield, and with fewer to no voids. These results further benefit subsequent steps, including removal of the material of the dummy gate layer 62 and the dummy dielectric layer 60 (e.g., removal of the dummy gates in FIGS. 19A-19B).

In some embodiments, depending on various parameters and dimensions of features, the gaps $G_C$ may need to be greater than or equal to a desired dimension in order to achieve the above-described benefits. For the sake of example herein, the gaps $G_C$ may need to be greater than or equal to 15 nm to achieve such benefits. As such, dimensions of some features or other parameters may be adjusted to achieve additional benefits. For example, with respect to the exemplary embodiment (e.g., exemplary distance $D_N$ being 50 nm, the collective thickness of the silicon layer 232 and the dummy dielectric layer 60 being 3.5 nm, and the gaps $G_C$ being at least 15 nm each), the widths $W_A$ of the dielectric fins 210 may be up to 13 nm. As discussed in greater detail below, some of the dielectric fins 210 assist in providing electrical isolation between adjacent gate electrodes (see FIGS. 21A-21D). As such, the dielectric fins 210 having larger widths $W_A$ provide improved insulation between those adjacent gate electrodes while also reducing any harmful effects of conductive material of the gate electrodes that may diffuse into the dielectric fins 210.

FIGS. 14A through 23B illustrate various additional steps in the manufacturing of embodiment devices. FIGS. 14A through 23B illustrate features in either of the n-type region 50N and the p-type region 50P. For example, the structures illustrated in FIGS. 14A through 23B may be applicable to both the n-type region 50N and the p-type region 50P.

Differences (if any) in the structures of the n-type region 50N and the p-type region 50P are described in the text accompanying each figure.

Figure 14A:
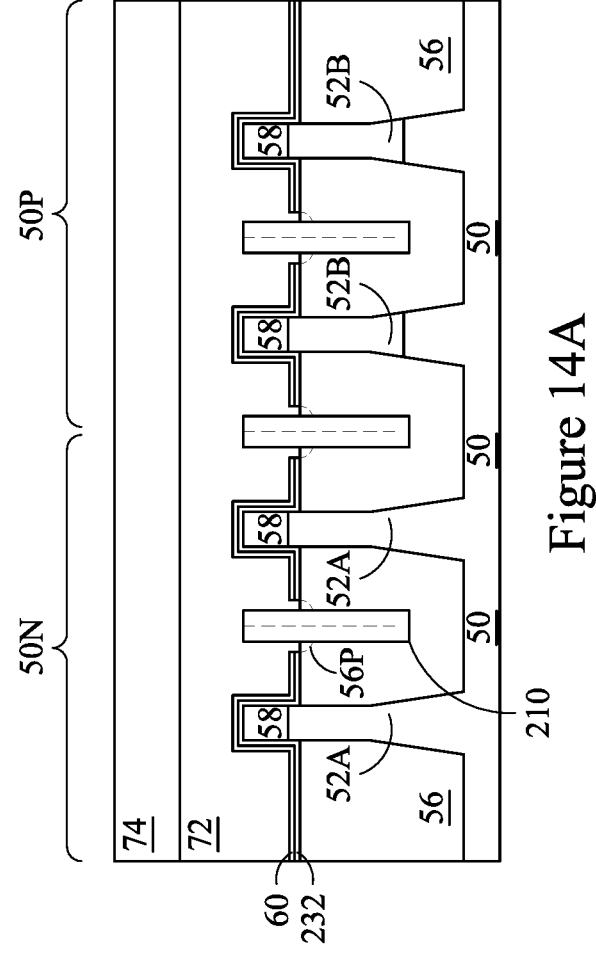
Figure 14B:
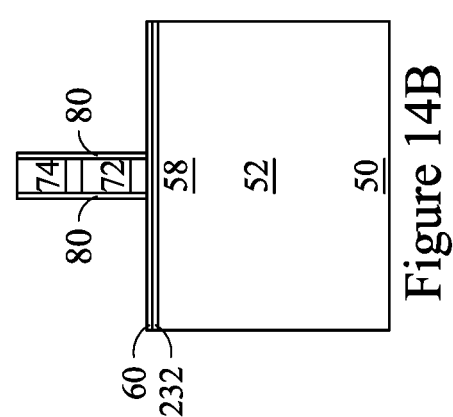

In FIGS. 14A and 14B, the mask layer 64 (see FIG. 13) may be patterned using acceptable photolithography and etching techniques to form masks 74. The pattern of the masks 74 then may be transferred to the dummy gate layer 62. In some embodiments (not specifically illustrated), the pattern of the masks 74 may also be transferred to the dummy dielectric layer 60 (and the underlying silicon layer 232) by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

In some embodiments, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 8, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 15A:
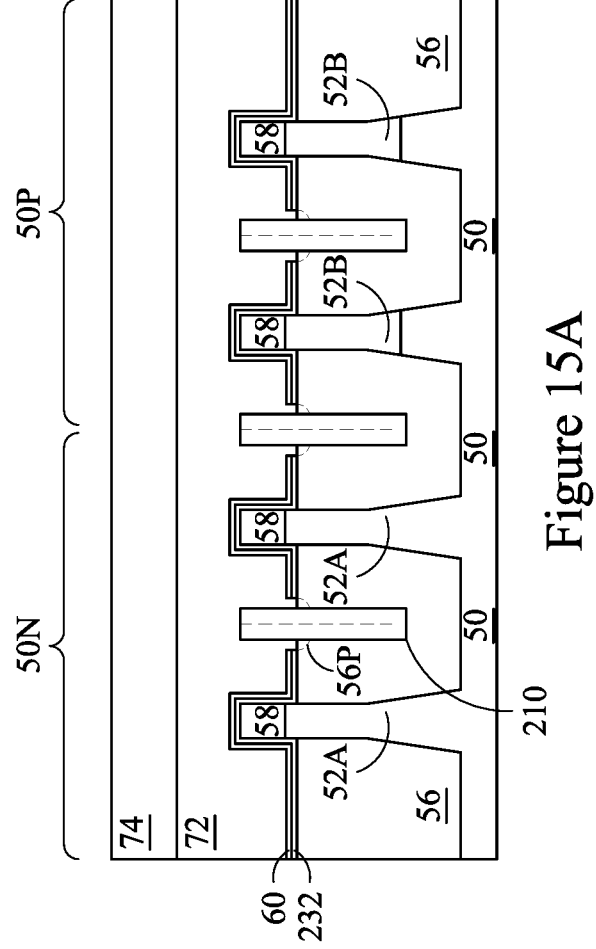
Figure 15B:
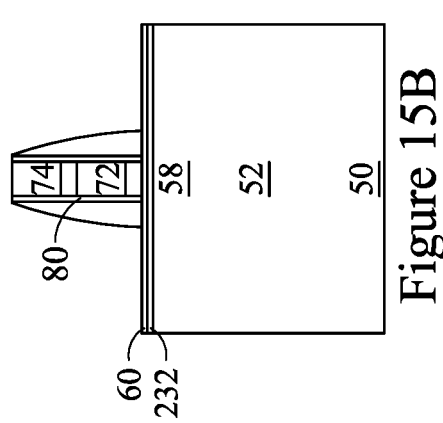

In FIGS. 15A and 15B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 16A-16D, epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon germanium, boron doped silicon germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 16A:
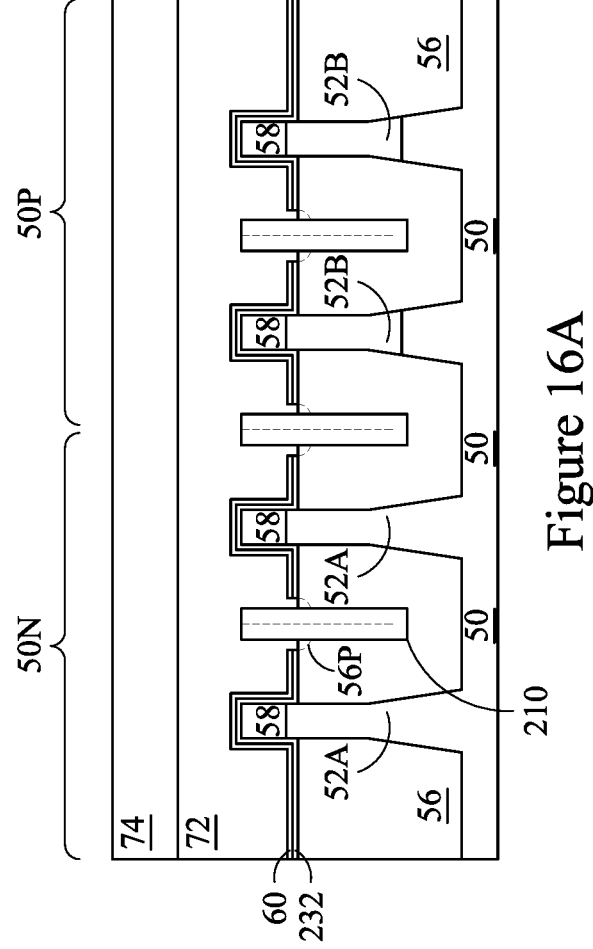
Figure 16B:
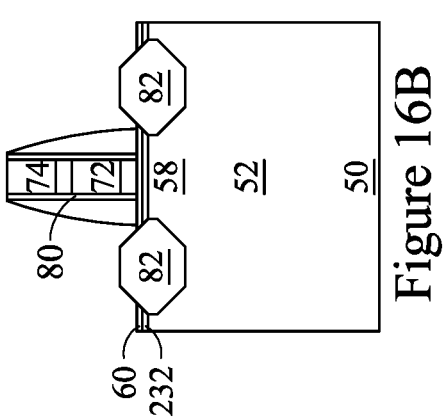
Figure 16D:
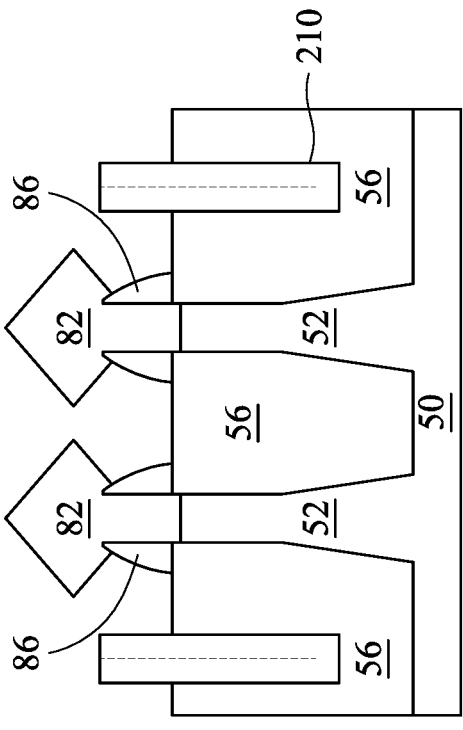
Figure 16C:
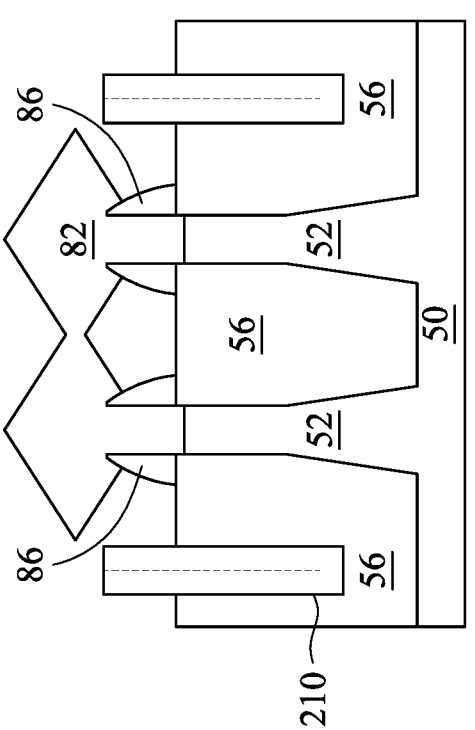
Figure 17A:
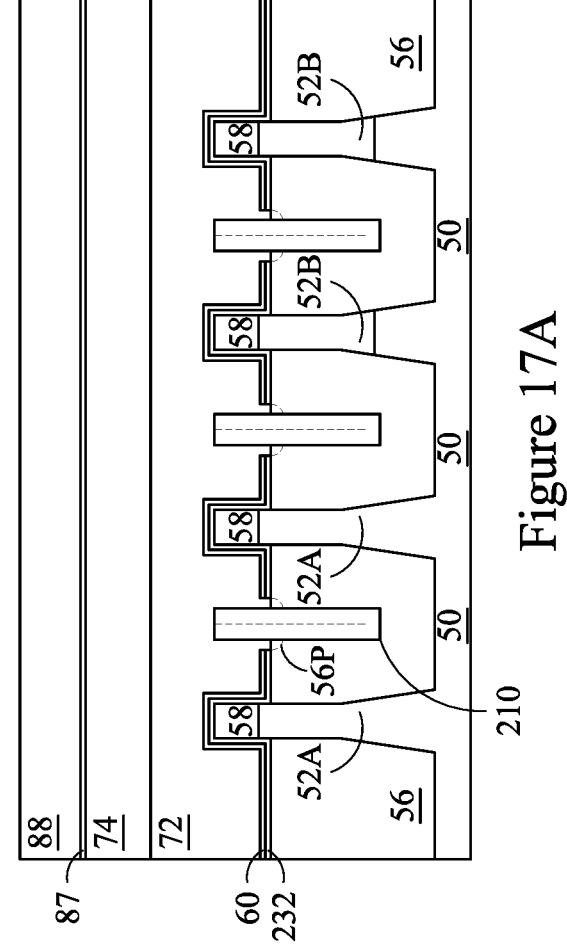
Figure 17B:
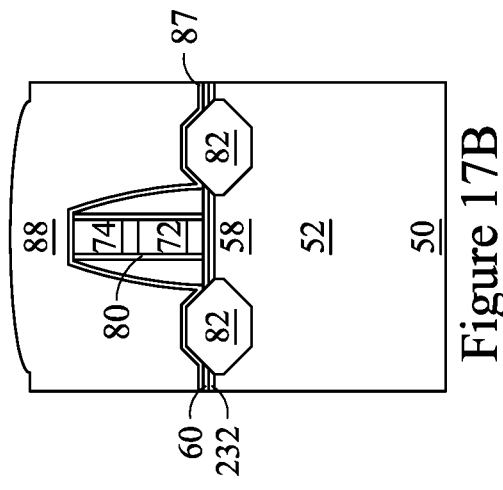
Figure 17D:
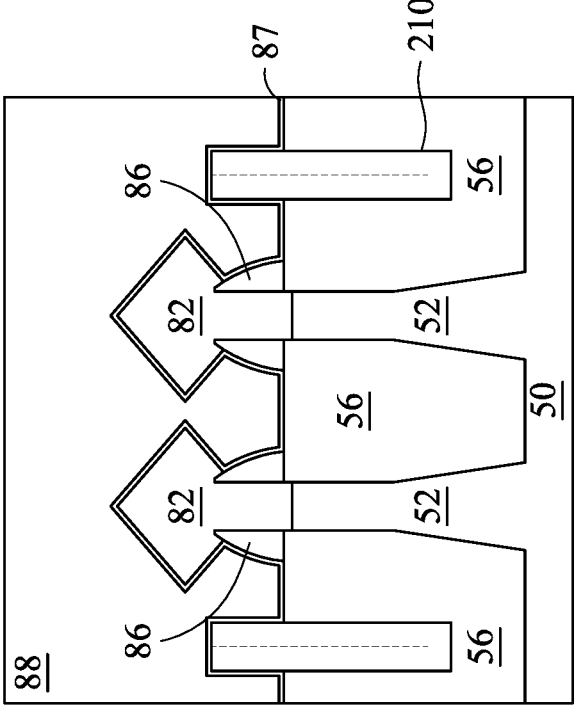
Figure 17C:
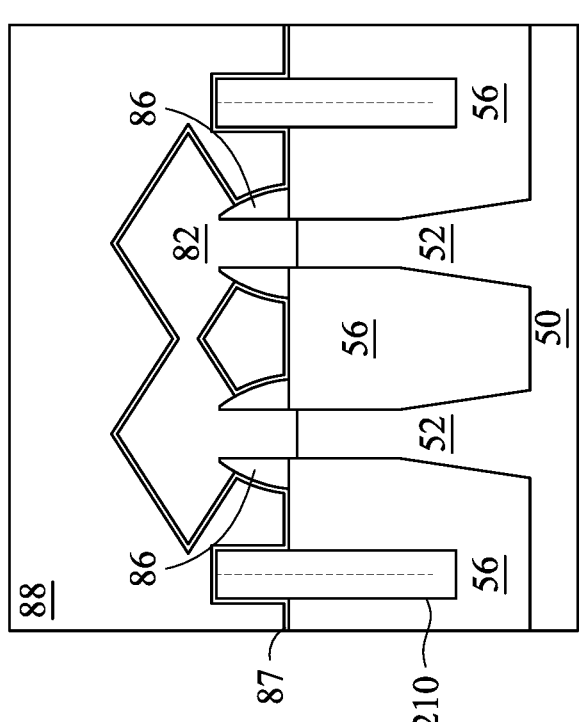

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 16C. In other embodiments, adjacent source/drain regions 82 remain separated after the epitaxy process is completed as illustrated by FIG. 16D. In the embodiments illustrated in FIGS. 16C and 16D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56. Note that the fins 52 illustrated in FIGS. 16C and 16D may be applicable to either the fins 52A or the fins 52B.

In FIGS. 17A-17D, a first interlayer dielectric (ILD) 88 is deposited over the structure illustrated in FIGS. 16A-16D. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 18A:
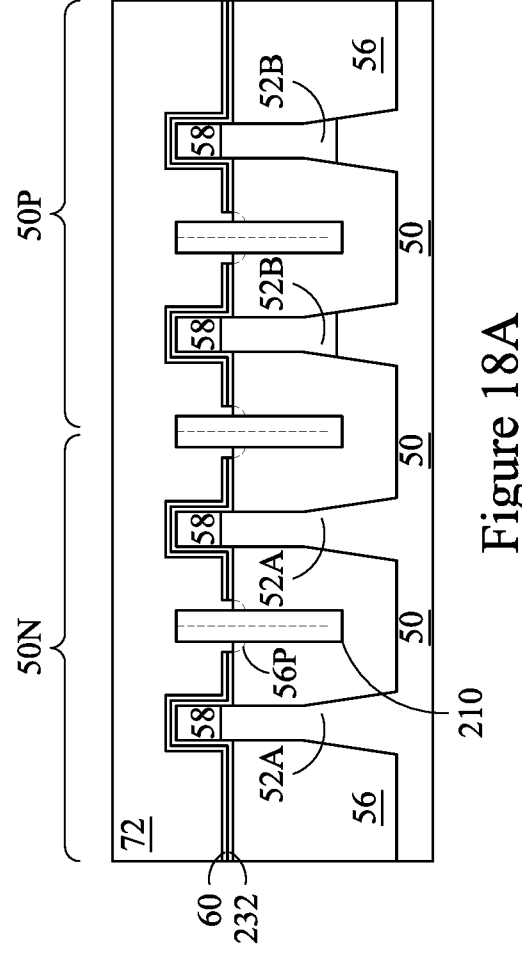
Figure 18B:
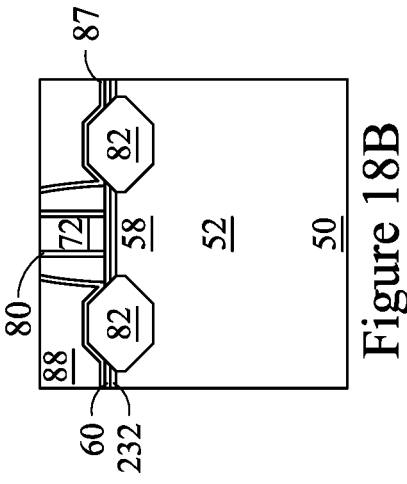

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 19A:
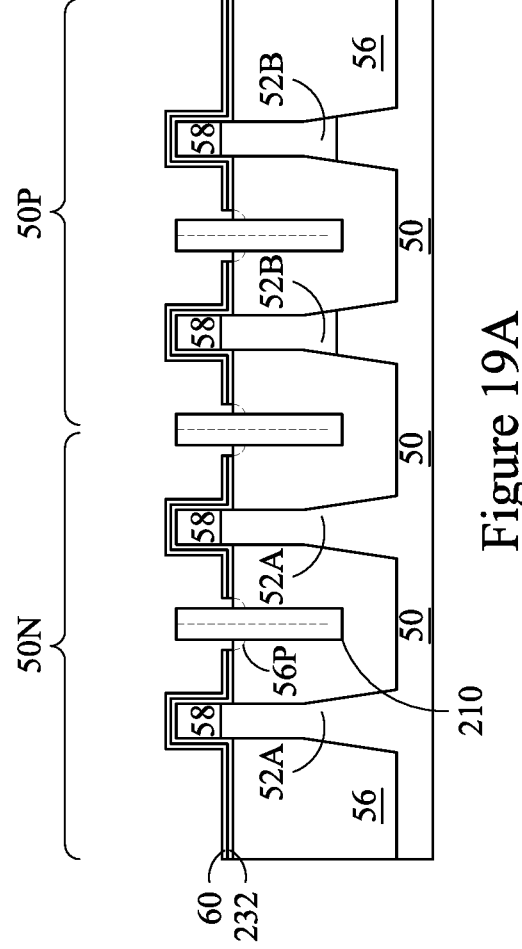
Figure 19B:
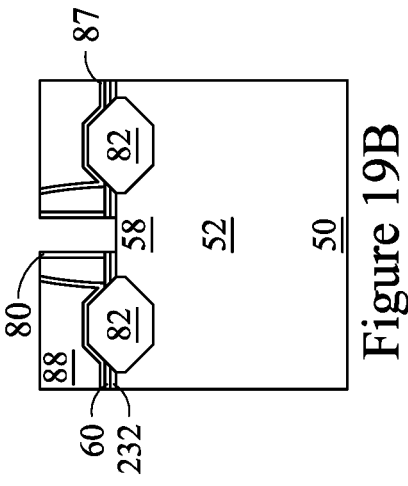

In FIGS. 19A and 19B, the dummy gates 72, and the masks 74 if present, are removed in an etching step(s), so that recesses 90 are formed. Portions of the dummy dielec-tric layer 60 and the silicon layer 232 (if present) in the recesses 90 may also be removed (e.g., including within the gap regions 220). In some embodiments, only the dummy gates 72 are removed and the dummy dielectric layer 60 remains and is exposed by the recesses 90. In some embodi-ments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 and the silicon layer 232 may be used as an etch stop layer when the dummy gates 72 are etched. The dummy dielectric layer 60 and the silicon layer 232 may then be optionally removed after the removal of the dummy gates 72. In some embodiments (not specifically illustrated), the portions 56P of the STI regions 56 proximal (e.g., directly adjacent) to the dielectric fins 210 (e.g., which were exposed after removing the silicon layer 232 and the dummy dielec-tric layer 60 from the dielectric fins 210) may become recessed due to being partially etched during the removal of the dummy dielectric layer 60 discussed with respect to FIGS. 19A-19B.

Removal of the dummy gates 72 and the dummy dielec-tric layer 60 is improved by the previous steps which widened the gap regions 220 from the gaps $G_B$ to the gaps $G_C$ (see FIG. 12). In particular, the wider gap regions 220 allow for the dummy gates 72 to be removed more efficiently and at a higher yield because the etchants may more easily reach all corners of the gap regions 220. In addition, the prevention of voids during the deposition of the dummy gate layer 62 (see FIG. 13) ensures that the removal process of the dummy gates 72 and the dummy dielectric layer 60 can be better controlled with reduced risk of damaging other features, e.g., by over-etching. In embodiments in which some or all of the dielectric fins 210 have greater widths $W_A$, these benefits and the previously discussed benefits may still be achieved. Further, an additional benefit includes that any damage caused to the dielectric fins 210 during this removal process will have reduced impact on the electrical isolation capabilities of these wider dielectric fins 210.

Figure 20A:
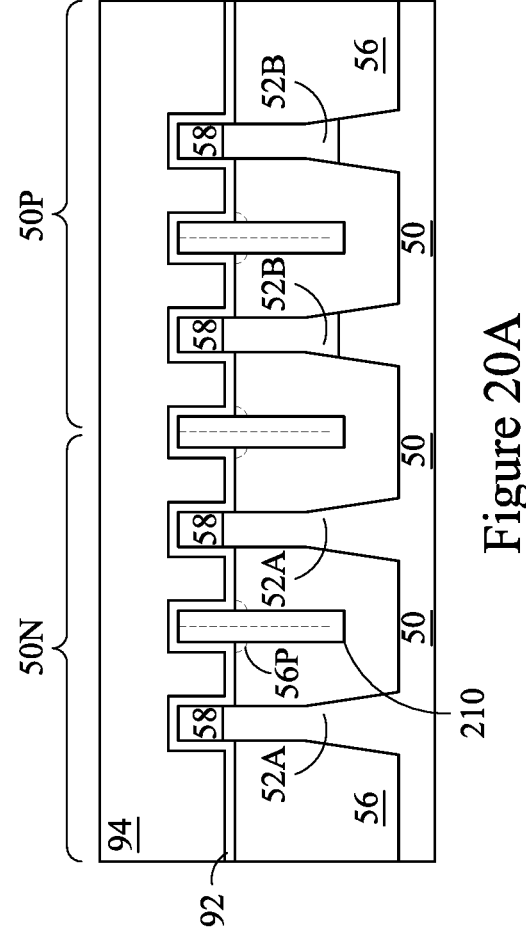
Figure 20B:
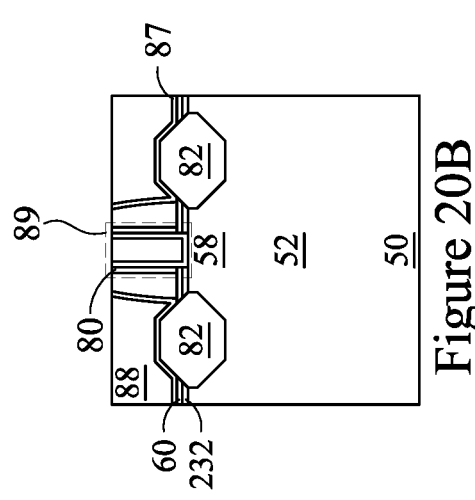
Figure 20C:
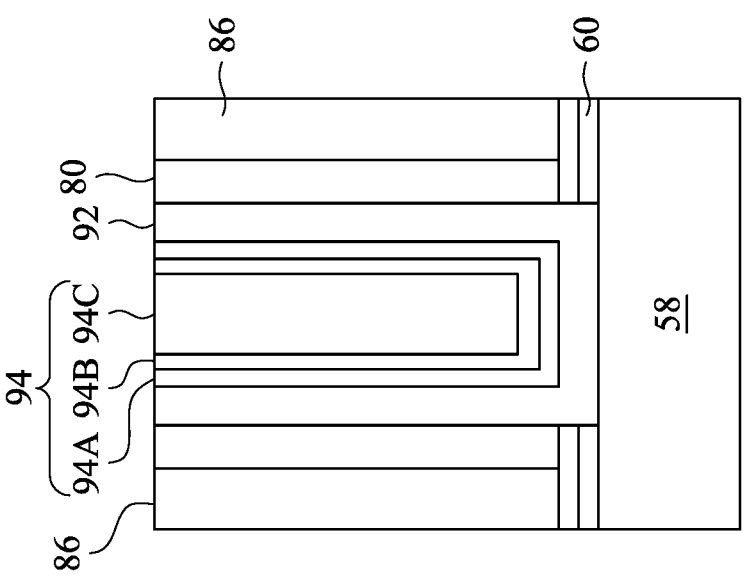
Figure 21A:
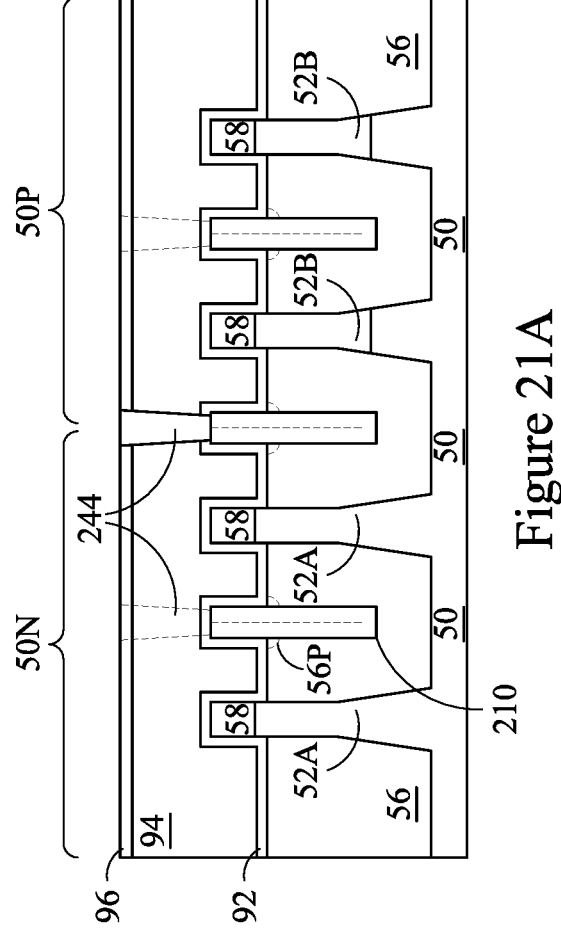
Figure 21B:
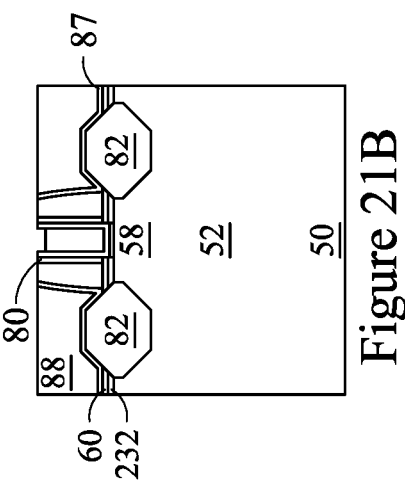
Figure 21D:
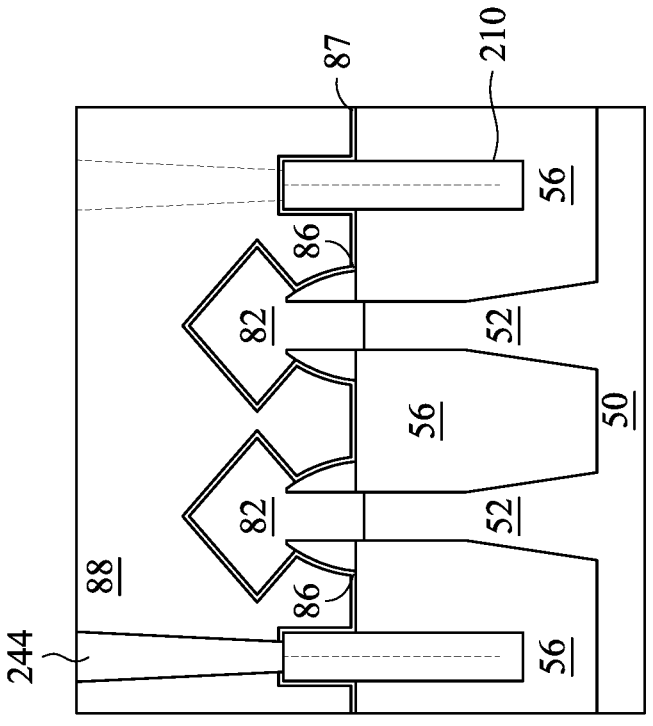
Figure 21C:
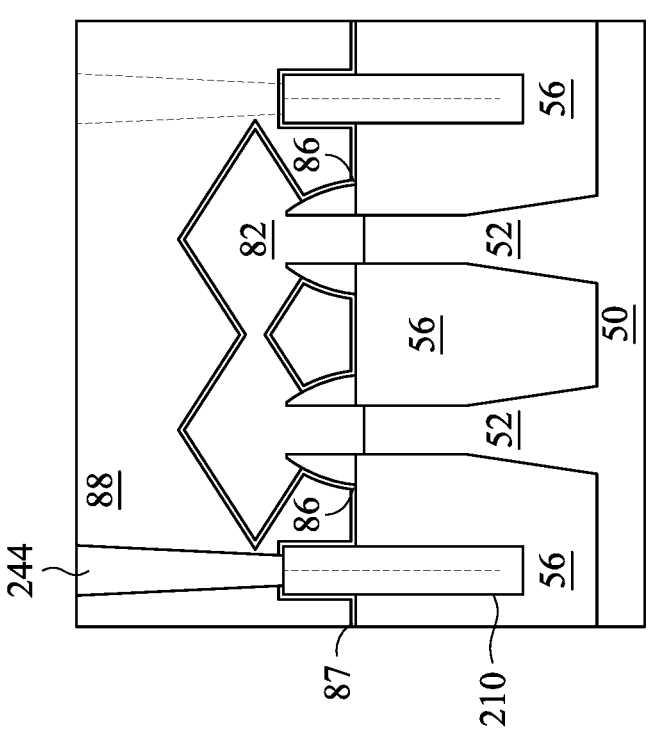

In FIGS. 20A-20C, gate dielectric layers 92 and gate electrodes 94 are formed for replacement gates. FIG. 20C illustrates a detailed view of region 89 of FIG. 20B. Gate dielectric layers 92 deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an inter-facial layer of silicon oxide formed by thermal or chemical oxidation and an overlying high-k dielectric material, such as a metal oxide or a silicate of hafnium, aluminum, zirco-nium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$). In addition, in embodiments in which the portions 56P of the STI regions 56 proximal (e.g., directly adjacent) to the dielectric fins 210 were partially etched during the removal of the dummy dielectric layer 60, the gate dielectrics layers 92 may further form in those corresponding recesses.

The gate electrodes 94 are deposited over the gate dielec-tric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In FIGS. 21A-21D, a gate mask 96 is formed over the gate stack (including a gate dielectric layer 92 and a corresponding gate electrode 94), and the gate mask 96 may be disposed between opposing portions of the gate spacers 86. In addition, a gate isolation region 244 is formed through the gate electrode 94 and to some of the dielectric fins 210. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88. The gate mask 96 is optional and may be omitted in some embodiments. In such embodiments, the gate stack may remain level with top surfaces of the first ILD 88.

After forming the gate mask 96, one or more etching processes are performed to form openings and expose the dielectric fins 210. The etching processes may include forming an etching mask (such as a photoresist or a tri-layer etching mask, not specifically illustrate), patterning the etching mask, and etching the gate masks 96, the ILD 88, the CESL 87, the gate electrode 94, and the gate dielectric layers 92 to form openings.

A dielectric material is deposited in the openings to form the structure of the gate isolation region 244. In accordance with some embodiments, the dielectric material is formed of a homogeneous dielectric material such as silicon nitride, silicon oxide, or the like. In some embodiments, the dielectric material comprises a plurality of dielectric layers. For example, the dielectric material may comprise a dielectric liner formed of a first dielectric material, and a second dielectric material over the dielectric liner. The second dielectric material is different from the first dielectric material. For example, the first dielectric material may comprise silicon oxide, and the second dielectric material may comprise silicon nitride. Alternatively, the first dielectric material may comprise silicon nitride, and the second dielectric material may comprise silicon oxide.

After depositing the dielectric material(s), a planarization process is performed to level the top surface of the dielectric material(s). In some embodiments (not specifically illustrated), after the planarization process, a portion of the dielectric material may be left overlapping the gate mask 96 to act as a hard mask layer. In accordance with alternative embodiments, the planarization process is performed until the top surface of the gate mask 96 or the gate electrode 94 is exposed. The portions of the dielectric material in the openings form the gate isolation regions 244, which may also be referred to as cut metal gate (CMG) regions. The gate isolation regions 244 and the dielectric fins 210 work in conjunction to electrically isolation the gate electrodes 94 on opposing sides.

Figure 22A:
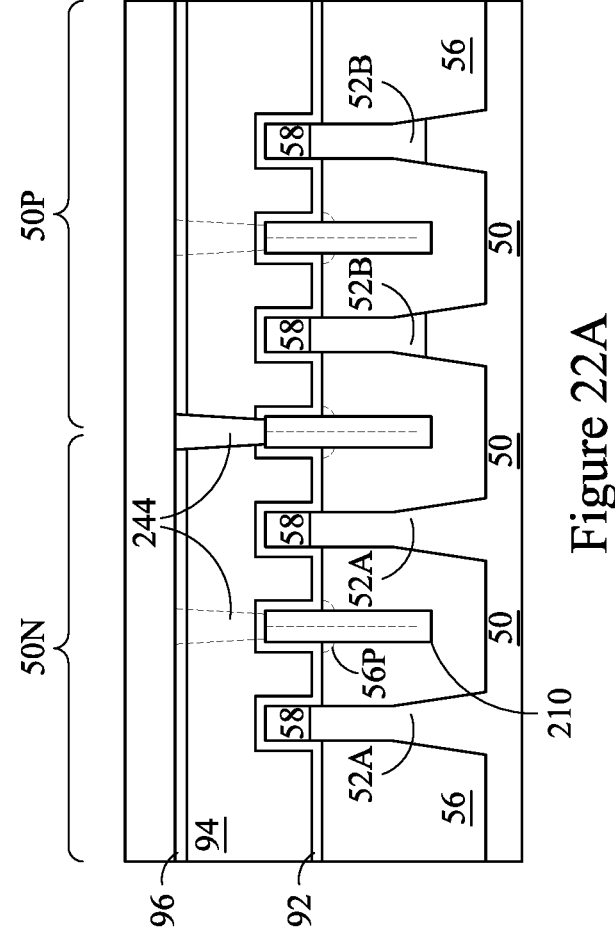
Figure 22B:
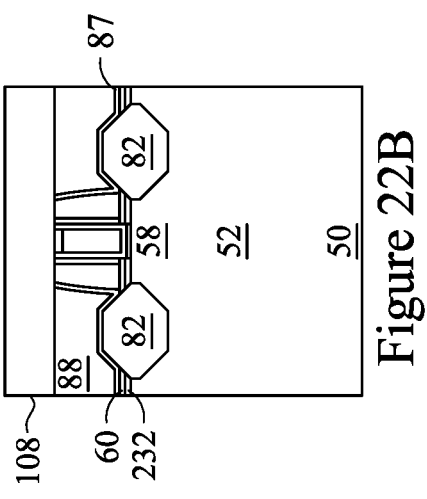

In FIGS. 22A and 22B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 23A and 23B) penetrate through the second ILD 108 and the gate mask 96 (if present) to contact the top surface of the recessed gate electrode 94.

Figure 23A:
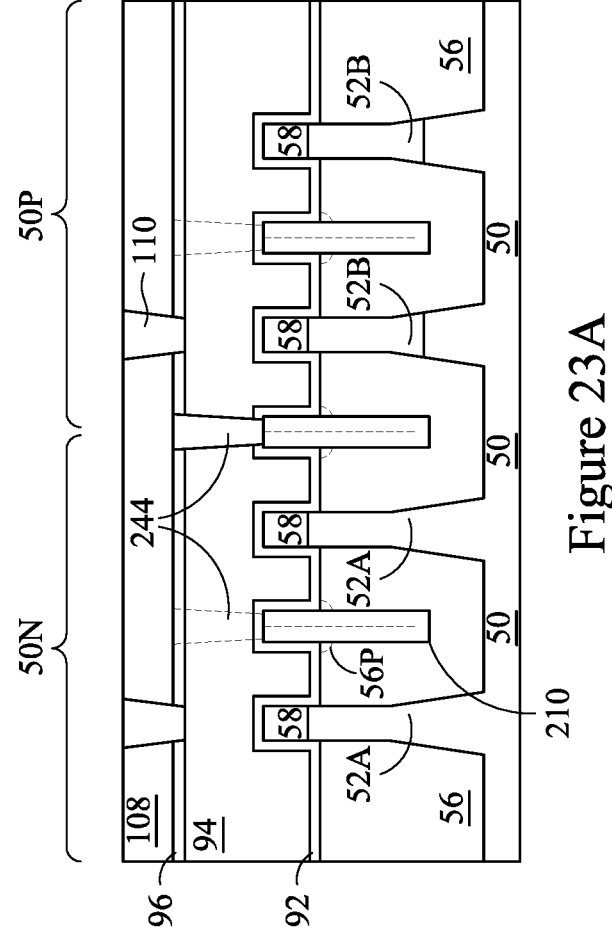
Figure 23B:
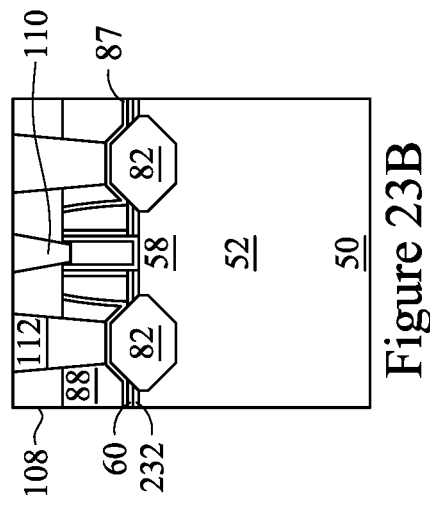

In FIGS. 23A and 23B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

It should be appreciated that the embodiments disclosed herein are applicable to the fins 52A (e.g., comprising silicon), the fins 52B (e.g., comprising silicon germanium) and their corresponding dielectric fins 210. In addition, dimensions associated with the fins 52A and corresponding dielectric fins 210 may be analogous (e.g., substantially the same) or different from dimensions associated with the fins 52B and corresponding dielectric fins 210. Further, dimensions associated with a fin 52A and a fin 52B separated from one another by a corresponding dielectric fin 210 may be analogous to the fins 52A, 52B on opposing sides. For example, a gap region 220 with the fin 52A may have differences from a gap region 220 with the fin 52B, wherever applicable and consistent with the discussion above.

Advantages may be achieved. For example, the disclosed embodiments facilitate an increase in the gaps $G_A$ between the fins 52 and the dielectric fins 210 in order to improve various steps, including deposition of the dummy gate layer 62 and removal of the dummy gate 72 and the dummy dielectric layer 60. In addition, the disclosed embodiments allow for adjustments to dimensions of various features, such as widening some or all of the dielectric fins 210 to improve isolation between adjacent gate electrodes 94. Further, the disclosed embodiments allow for adjustments to various process parameters, such as decreasing the durations of depositing the dummy gate layer 62 or of removing the dummy gate 72 and the dummy dielectric layer 60.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

In an embodiment, a method includes: forming a plurality of fins over a substrate, the plurality of fins comprising: a first semiconductor fin adjacent to an isolation region; and a dielectric fin embedded in the isolation region; depositing a silicon layer over a first surface of the first semiconductor fin, a second surface of the dielectric fin, and a third surface of the isolation region; forming an oxide layer over the silicon layer; removing a portion of the oxide layer and the silicon layer to expose the second surface of the dielectric fin; forming a dummy gate over a remaining portion of the oxide layer and between the plurality of fins; forming a first epitaxial region in the first semiconductor fin; and replacing the dummy gate with a gate structure. In another embodiment, the plurality of fins comprises a second semiconductor fin adjacent to the isolation region, and wherein the dielectric fin is interposed between the first semiconductor fin and the second semiconductor fin. In another embodiment, the first semiconductor fin and the second semiconductor fin comprise different materials. In another embodiment, a thickness of the silicon layer over the first semiconductor fin is different from a thickness of the silicon layer over the second semiconductor fin. In another embodiment, replacing the dummy gate with the gate structure comprises: removing the dummy gate; removing the remaining portion of the oxide layer; forming a gate dielectric over the first semiconductor fin; and forming a gate electrode over the gate dielectric. In another embodiment, removing the portion of the oxide layer and the silicon layer to expose the dielectric fin comprises exposing a portion of the isolation region proximal to the dielectric fin, and wherein removing the remaining portion of the oxide layer comprises removing the portion of the isolation region proximal to the dielectric fin.

In an embodiment, a method includes: forming first fins over a first region of a substrate, the first fins comprising a silicon fin and a first dielectric fin; forming second fins over a second region of the substrate, the second fins comprising a silicon germanium fin and a second dielectric fin; forming a first isolation region and a second isolation region over the substrate, the first isolation region interposed between the silicon fin and the first dielectric fin, a first gap region being above the first isolation region and between the first fins, the second isolation region being interposed between the silicon germanium fin and the second dielectric fin, a second gap region being above the second isolation region and between the second fins; forming a silicon layer over the first fins, the first isolation region, the second fins, and the second isolation region; forming an oxide layer over the silicon layer, wherein forming the silicon layer and forming the oxide layer comprise reducing a first lateral width of the first gap region and a second lateral width of the second gap region; etching portions of the oxide layer and the silicon layer to expose the first dielectric fin and the second dielectric fin, wherein etching the portions of the oxide layer and the silicon layer comprises increase the first lateral width of the first gap region and the second lateral width of the second gap region; forming a first gate structure over the first fins and within the first gap region; and forming a second gate structure over the second fins and within the second gap region. In another embodiment, forming the silicon layer is performed at temperatures less than or equal to 450° C. In another embodiment, a first portion of the silicon layer over the silicon fin has a first crystallinity, wherein a second portion of the silicon layer over the first dielectric fin has a second crystallinity, and wherein the first crystallinity is greater than the second crystallinity. In another embodiment, the silicon layer has a first thickness along the silicon fin, a second thickness along the silicon germanium fin, and a third thickness along the first dielectric fin, and wherein the third thickness is less than the first thickness and the second thickness. In another embodiment, the first thickness is greater than the second thickness. In another embodiment, the method further includes, before forming the silicon layer, nitridizing exposed surfaces of the silicon fin, the first dielectric fin, the silicon germanium fin, and the second dielectric fin. In another embodiment, the method further includes: removing the first gate structure and the second gate structure; forming a first replacement gate structure over the first fins; and forming a second replacement gate structure over the second fins. In another embodiment, the method further includes: etching an opening in the first gate structure to expose the first dielectric fin; and forming a gate isolation region in the opening.

In an embodiment, a method includes: forming a semiconductor fin and a dielectric fin in an insulation material disposed over a substrate; recessing the insulation material to form an isolation region, the semiconductor fin and the dielectric fin protruding above an upper surface of the isolation region; depositing a silicon layer over a first surface of the semiconductor fin, a second surface of the dielectric fin, and the upper surface of the isolation region; depositing a dummy dielectric layer over the silicon layer; removing portions of the dummy dielectric layer and the silicon layer from the second surface of the dielectric fin; and forming dummy gate over the semiconductor fin and the dielectric fin, the dummy gate being in physical contact with the isolation region. In another embodiment, after depositing the dummy dielectric layer, a first gap remains above the isolation region and between sidewalls of the dummy dielectric layer, wherein the first gap is less than a desired dimension, wherein after removing the portions of the dummy dielectric layer and the silicon layer, a second gap remains above the isolation region and between a remaining sidewall of the dummy dielectric layer and the dielectric fin, and wherein the second gap is greater than the desired dimension. In another embodiment, a first segment of the silicon layer along the first surface of the semiconductor fin has a different crystallinity than a second segment of the silicon layer along the second surface of the dielectric fin and the upper surface of the isolation region. In another embodiment, the first segment has a greater crystallinity than the second segment. In another embodiment, the method further includes: removing the dummy gate; and removing the dummy dielectric layer, wherein removing the dummy dielectric layer comprises etching a portion of the isolation region proximal to the dielectric fin. In another embodiment, the method further includes, before depositing the silicon layer, performing a nitrogen soak treatment to nitridize the first surface of the semiconductor fin, the second surface of the dielectric fin, and the upper surface of the isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a plurality of fins over a substrate, the plurality of fins comprising:
    a first semiconductor fin adjacent to an isolation region; and
    a dielectric fin embedded in the isolation region;
depositing a silicon layer over a first surface of the first semiconductor fin, a second surface of the dielectric fin, and a third surface of the isolation region;
forming an oxide layer over the silicon layer;
removing a portion of the oxide layer and the silicon layer to expose the second surface of the dielectric fin;
forming a dummy gate over a remaining portion of the oxide layer and between the plurality of fins;
forming a first epitaxial region in the first semiconductor fin; and
replacing the dummy gate with a gate structure.

2. The method of claim 1, wherein the plurality of fins comprises a second semiconductor fin adjacent to the isolation region, and wherein the dielectric fin is interposed between the first semiconductor fin and the second semiconductor fin.

3. The method of claim 2, wherein the first semiconductor fin and the second semiconductor fin comprise different materials.

4. The method of claim 3, wherein a thickness of the silicon layer over the first semiconductor fin is different from a thickness of the silicon layer over the second semiconductor fin.

5. The method of claim 1, wherein replacing the dummy gate with the gate structure comprises:
    removing the dummy gate;
    removing the remaining portion of the oxide layer;
    forming a gate dielectric over the first semiconductor fin; and
    forming a gate electrode over the gate dielectric.

6. The method of claim 5, wherein removing the portion of the oxide layer and the silicon layer to expose the dielectric fin comprises exposing a portion of the isolation region proximal to the dielectric fin, and wherein removing the remaining portion of the oxide layer comprises removing the portion of the isolation region proximal to the dielectric fin.

7. A method, comprising:
forming first fins over a first region of a substrate, the first fins comprising a silicon fin and a first dielectric fin;
forming second fins over a second region of the substrate, the second fins comprising a silicon germanium fin and a second dielectric fin;
forming a first isolation region and a second isolation region over the substrate, the first isolation region interposed between the silicon fin and the first dielectric fin, a first gap region being above the first isolation region and between the first fins, the second isolation region being interposed between the silicon germanium fin and the second dielectric fin, and a second gap region being above the second isolation region and between the second fins;
forming a silicon layer over the first fins, the first isolation region, the second fins, and the second isolation region;
forming an oxide layer over the silicon layer, wherein forming the silicon layer and forming the oxide layer comprises reducing a first lateral width of the first gap region and a second lateral width of the second gap region;
etching portions of the oxide layer and the silicon layer to expose the first dielectric fin and the second dielectric fin, wherein etching the portions of the oxide layer and the silicon layer comprises increasing the first lateral width of the first gap region and the second lateral width of the second gap region;
forming a first gate structure over the first fins and within the first gap region; and
forming a second gate structure over the second fins and within the second gap region.

8. The method of claim 7, wherein forming the silicon layer is performed at temperatures less than or equal to 450° C.

9. The method of claim 8, wherein a first portion of the silicon layer over the silicon fin has a first crystallinity, wherein a second portion of the silicon layer over the first dielectric fin has a second crystallinity, and wherein the first crystallinity is greater than the second crystallinity.

10. The method of claim 7, wherein the silicon layer has a first thickness along the silicon fin, a second thickness along the silicon germanium fin, and a third thickness along the first dielectric fin, and wherein the third thickness is less than the first thickness and the second thickness.

11. The method of claim 10, wherein the first thickness is greater than the second thickness.

12. The method of claim 7, further comprising, before forming the silicon layer, nitridizing exposed surfaces of the silicon fin, the first dielectric fin, the silicon germanium fin, and the second dielectric fin.

13. The method of claim 7, further comprising:
removing the first gate structure and the second gate structure;
forming a first replacement gate structure over the first fins; and
forming a second replacement gate structure over the second fins.

14. The method of claim 13, further comprising:
etching an opening in the first gate structure to expose the first dielectric fin; and
forming a gate isolation region in the opening.

15. A method, comprising:

forming a semiconductor fin and a dielectric fin in an insulation material disposed over a substrate;

recessing the insulation material to form an isolation region, the semiconductor fin and the dielectric fin protruding above an upper surface of the isolation region;

depositing a silicon layer over a first surface of the semiconductor fin, a second surface of the dielectric fin, and the upper surface of the isolation region;

depositing a dummy dielectric layer over the silicon layer;

removing portions of the dummy dielectric layer and the silicon layer from the second surface of the dielectric fin; and forming a dummy gate over the semiconductor fin and the dielectric fin, the dummy gate being in physical contact with the isolation region.

16. The method of claim 15, wherein after depositing the dummy dielectric layer, a first gap remains above the isolation region and between sidewalls of the dummy dielectric layer, wherein the first gap is less than a desired dimension, wherein after removing the portions of the dummy dielectric layer and the silicon layer, a second gap remains above the isolation region and between a remaining sidewall of the dummy dielectric layer and the dielectric fin, and wherein the second gap is greater than the desired dimension.

17. The method of claim 15, wherein a first segment of the silicon layer along the first surface of the semiconductor fin has a different crystallinity than a second segment of the silicon layer along the second surface of the dielectric fin and the upper surface of the isolation region.

18. The method of claim 17, wherein the first segment has a greater crystallinity than the second segment.

19. The method of claim 15, further comprising:

removing the dummy gate; and removing the dummy dielectric layer, wherein removing the dummy dielectric layer comprises etching a portion of the isolation region proximal to the dielectric fin.

20. The method of claim 15, further comprising, before depositing the silicon layer, performing a nitrogen soak treatment to nitridize the first surface of the semiconductor fin, the second surface of the dielectric fin, and the upper surface of the isolation region.

* * * * *